(12) United States Patent
Bae et al.

(10) Patent No.: US 11,824,395 B2
(45) Date of Patent: Nov. 21, 2023

(54) BATTERY MANAGEMENT APPARATUS

(71) Applicant: LG ENERGY SOLUTION, LTD., Seoul (KR)

(72) Inventors: Yoon-Jung Bae, Daejeon (KR); A-Ming Cha, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 489 days.

(21) Appl. No.: 17/270,548

(22) PCT Filed: Feb. 28, 2020

(86) PCT No.: PCT/KR2020/002900
§ 371 (c)(1),
(2) Date: Feb. 23, 2021

(87) PCT Pub. No.: WO2020/189918
PCT Pub. Date: Sep. 24, 2020

(65) Prior Publication Data
US 2021/0218262 A1   Jul. 15, 2021

(30) Foreign Application Priority Data

Mar. 18, 2019 (KR) ........................ 10-2019-0030709

(51) Int. Cl.
*H02J 7/00* (2006.01)
*G01R 31/392* (2019.01)
(Continued)

(52) U.S. Cl.
CPC .... *H02J 7/007182* (2020.01); *G01R 31/3835* (2019.01); *G01R 31/392* (2019.01);
(Continued)

(58) Field of Classification Search
CPC .... H02J 7/007182; H02J 7/005; H02J 7/0013; G01R 31/392; G01R 31/396; G01R 31/3835
(Continued)

(56) References Cited

U.S. PATENT DOCUMENTS

2007/0252600 A1   11/2007 Chou et al.
2010/0036626 A1   2/2010 Kang et al.
(Continued)

FOREIGN PATENT DOCUMENTS

CN   108896916 A   * 11/2018
CN   109073709 A   * 12/2018
(Continued)

OTHER PUBLICATIONS

Search Report for European Application No. 20774556.3 dated Sep. 22, 2021. 2 pgs.
(Continued)

*Primary Examiner* — Suresh Memula
(74) *Attorney, Agent, or Firm* — Bryan Cave Leighton Paisner LLP

(57) ABSTRACT

A battery management apparatus for providing more specific information about degradation of a battery cell and changing a control condition according to a degradation pattern of the battery cell. Since not only the degradation degree of the battery cell but also the degradation pattern of the battery cell is estimated, the present state of the battery cell may be more accurately estimated.

15 Claims, 5 Drawing Sheets

(51) Int. Cl.
*G01R 31/396* (2019.01)
*G01R 31/3835* (2019.01)

(52) U.S. Cl.
CPC ............ *G01R 31/396* (2019.01); *H02J 7/005* (2020.01); *H02J 7/0013* (2013.01)

(58) Field of Classification Search
USPC ........................................................ 320/134
See application file for complete search history.

(56) References Cited

U.S. PATENT DOCUMENTS

| | | |
|---|---|---|
| 2010/0042345 A1 | 2/2010 | Kang et al. |
| 2010/0085009 A1 | 4/2010 | Kang et al. |
| 2013/0069598 A1 | 3/2013 | Tanaka et al. |
| 2013/0162218 A1 | 6/2013 | Kang et al. |
| 2013/0166233 A1 | 6/2013 | Suh et al. |
| 2015/0268309 A1 | 9/2015 | Kim |
| 2015/0291050 A1 | 10/2015 | Luo et al. |
| 2015/0355288 A1* | 12/2015 | Yokoyama ........ H01M 10/4285 702/63 |
| 2016/0190658 A1 | 6/2016 | Ishibashi et al. |
| 2016/0254680 A1 | 9/2016 | Arai et al. |
| 2017/0146609 A1 | 5/2017 | Uchino et al. |
| 2018/0210036 A1 | 7/2018 | Yamauchi et al. |
| 2023/0280412 A1* | 9/2023 | Fasching ............. G01R 31/396 429/90 |

FOREIGN PATENT DOCUMENTS

| | | | | |
|---|---|---|---|---|
| CN | 105467325 | B | * | 10/2019 |
| CN | 110333450 | A | * | 10/2019 |
| CN | 112912747 | A | * | 6/2021 |
| EP | 2837944 | A1 | * | 2/2015 |
| EP | 2529242 | B1 | * | 4/2021 |
| JP | H10322917 | A | * | 12/1998 |
| JP | 2003282156 | A | * | 10/2003 |
| JP | 200615914 | A | | 1/2006 |
| JP | 2007028844 | A | | 2/2007 |
| JP | 2007323999 | A | | 12/2007 |
| JP | 2009226996 | A | | 10/2009 |
| JP | 2013065481 | A | | 4/2013 |
| JP | 201496958 | A | | 5/2014 |
| JP | 2015104225 | A | | 6/2015 |
| JP | 6099918 | B2 | | 3/2017 |
| JP | 201754684 | A | | 3/2017 |
| JP | 6171821 | B2 | | 8/2017 |
| KR | 100927541 | B1 | | 11/2009 |
| KR | 20100019249 | A | | 2/2010 |
| KR | 101201110 | B1 | | 11/2012 |
| KR | 20140052558 | A | | 5/2014 |
| KR | 101402802 | B1 | | 6/2014 |
| KR | 101405001 | B1 | | 6/2014 |
| KR | 20160011448 | A | | 2/2016 |
| KR | 101783918 | B1 | | 10/2017 |
| KR | 101822594 | B1 | | 1/2018 |
| KR | 2022017560 | A | * | 2/2022 |
| WO | WO-2011122164 | A1 | * | 10/2011 |
| WO | WO-2019194205 | A1 | * | 10/2019 |
| WO | WO-2020189914 | A1 | * | 9/2020 |
| WO | WO-2020189915 | A1 | * | 9/2020 |
| WO | WO-2020189918 | A1 | * | 9/2020 |
| WO | WO-2020189919 | A1 | * | 9/2020 |
| WO | WO-2020226285 | A1 | * | 11/2020 |
| WO | WO-2021101041 | A1 | * | 5/2021 |
| WO | WO-2022207531 | A1 | * | 10/2022 |

OTHER PUBLICATIONS

International Search Report for Application No. PCT/KR2020/002900, dated Jun. 17, 2020, 2 pages.

* cited by examiner

ВАТТERY MANAGEMENT APPARATUS

CROSS-REFERENCE TO RELATED APPLICATIONS

The present application is a national phase entry under 35 U.S.C. § 371 of International Application No. PCT/KR2020/002900 filed Feb. 28, 2020, published in Korean, which claims priority from 10-2019-0030709 filed Mar. 18, 2019, all of which are] incorporated herein by reference.

TECHNICAL FIELD

The present disclosure relates to a battery management apparatus, and more particularly, to a battery management apparatus for changing a control condition according to a degradation pattern of a battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

In recent years, as secondary batteries are applied to more fields, the secondary batteries are widely used not only in small-sized portable devices such as smartphones but also in medium-sized and large-sized devices such as electric vehicles including hybrid electric vehicles, and power storage devices.

The performance of the secondary battery degrades as the use period increases, compared to the initial stage. In addition, estimating the degree of performance degradation of the secondary battery is said to estimate the state of health (SOH) of the secondary battery, and the SOH of the secondary battery is an important factor in determining the replacement time of the secondary battery.

Conventionally, in Korean Publication KR 10-2016-0011448A, there has been proposed a device and method for measuring an open circuit voltage (OCV) of a battery, integrating a current flowing into the battery until the battery is fully charged, and calculating a full charge capacity charged to the battery by using the integrated current amount and the measured OCV.

However, KR 10-2016-0011448A just discloses a configuration that determines the degree of degradation on how much a battery has been degraded ex post facto by measuring the loss of the full charge capacity of the battery, and does not disclose a configuration that changes a battery control condition according to specific information related to the degradation of the battery such as a present degradation rate of the battery and the degree of degradation of the battery.

Accordingly, KR 10-2016-0011448A has a problem in that any specific information for determining a battery state at a future time point, such as a predicted deterioration rate or a predicted life of the battery, is not provided at all. In addition, KR 10-2016-0011448A only discloses a configuration for measuring a full charge capacity of a battery, and a configuration for changing a control condition according to a battery state is not disclosed at all.

SUMMARY

Technical Problem

The present disclosure is designed to solve the problems of the related art, and therefore the present disclosure is directed to providing a battery management apparatus, which may provide more specific information about degradation of a battery cell and change a control condition for the battery cell according to the degradation degree of the battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus, comprising: a voltage measuring unit configured to measure a voltage of a battery cell and measure an open circuit voltage (OCV) of the battery cell whenever the measured voltage reaches a reference discharge voltage; and a control unit configured to receive the OCV measured by the voltage measuring unit, compare the received OCV with a pre-stored reference voltage to calculate a voltage fluctuation rate, determine a voltage increase and decrease pattern based on the calculated voltage fluctuation rate and pre-stored voltage fluctuation rate data, determine a first degradation acceleration degree of the battery cell according to the determined voltage increase and decrease pattern, and change a preset control condition based on the received OCV and the first degradation acceleration degree.

The pre-stored reference voltage may be configured to include an OCV when the voltage of the battery cell reaches the reference discharge voltage at a predetermined cycle.

The pre-stored voltage fluctuation rate data may be configured to include a previous voltage fluctuation rate calculated by the control unit whenever the OCV is measured by the voltage measuring unit.

The control unit may be configured to calculate a rate of voltage change between a plurality of voltage fluctuation rates included within a predetermined number of cycles from a present cycle of the battery cell among the pre-stored voltage fluctuation rate data and the calculated voltage fluctuation rate, and determine the voltage increase and decrease pattern based on the calculated rate of voltage change.

The preset control condition may be configured to include at least one of a C-rate and a discharge termination voltage set for the battery cell.

Only when the first degradation acceleration degree is any one of accelerated degradation and linear degradation, the control unit may be configured to set an OCV of the battery cell previously measured at a start cycle of the determined voltage increase and decrease pattern as a reference OCV, calculate a voltage comparison value by comparing the set reference OCV with the OCV received from the voltage measuring unit, and change at least one of the C-rate and the discharge termination voltage based on a voltage conversion value obtained by converting the calculated voltage comparison value according to a preset voltage conversion criterion.

The preset voltage conversion criterion may be configured to include a first voltage conversion criterion for converting the calculated voltage comparison value into a value corresponding to the C-rate and a second voltage conversion criterion for converting the calculated voltage comparison value into a value corresponding to the discharge termination voltage.

The control unit may be configured to obtain a first voltage conversion value by converting the calculated voltage comparison value according to the first voltage conversion criterion, change the C-rate according to the obtained first voltage conversion value, obtain a second voltage conversion value by converting the calculated voltage comparison value according to the second voltage conversion criterion, and change the discharge termination voltage according to the obtained second voltage conversion value.

The control unit may be configured to change the preset voltage conversion criterion only when the determined first degradation acceleration degree is accelerated degradation and at least one of the C-rate and the discharge termination voltage is changed.

After the preset voltage conversion criterion is changed, the control unit may be configured to restore the preset voltage conversion criterion into a voltage conversion criterion before the change only when the first degradation acceleration degree is determined as linear degradation or decelerated degradation.

The control unit may be configured to calculate a present resistance of the battery cell based on the received OCV, calculate an electric resistance fluctuation rate by comparing the calculated present resistance with a pre-stored reference resistance, determine a resistance increase and decrease pattern based on the calculated electric resistance fluctuation rate and pre-stored electric resistance fluctuation rate data, determine a second degradation acceleration degree of the battery cell according to the determined voltage increase and decrease pattern and the determined resistance increase and decrease pattern, and change the preset control condition based on the calculated electric resistance fluctuation rate and the second degradation acceleration degree.

The pre-stored reference resistance may be configured to include a reference resistance calculated based on the pre-stored reference voltage.

The pre-stored electric resistance fluctuation rate data may be configured to include a previous electric resistance fluctuation rate calculated by the control unit whenever the OCV is measured by the voltage measuring unit.

The control unit may be configured to calculate a rate of resistance change between a plurality of electric resistance fluctuation rates included within a predetermined number of cycles from a present cycle of the battery cell among the pre-stored electric resistance fluctuation rate data and the calculated electric resistance fluctuation rate, and determine the resistance increase and decrease pattern based on the calculated rate of resistance change.

The preset control condition may be configured to include at least one of a C-rate and a discharge termination voltage set for the battery cell.

Only when the determined voltage increase and decrease pattern is a voltage increase pattern and the second degradation acceleration degree is any one of accelerated degradation and linear degradation, the control unit may be configured to set an electric resistance fluctuation rate of the battery cell previously measured at a start cycle of the determined resistance increase and decrease pattern as a reference electric resistance fluctuation rate, calculate a resistance comparison value by comparing the set reference electric resistance fluctuation rate with the calculated electric resistance fluctuation rate, and change at least one of the C-rate and the discharge termination voltage based on a resistance conversion value obtained by converting the calculated resistance comparison value according to a preset resistance conversion criterion.

The preset resistance conversion criterion may be configured to include a first resistance conversion criterion for converting the calculated resistance comparison value into a value corresponding to the C-rate and a second resistance conversion criterion for converting the calculated resistance comparison value into a value corresponding to the discharge termination voltage.

The control unit may be configured to obtain a first resistance conversion value by converting the calculated resistance comparison value according to the first resistance conversion criterion, change the C-rate according to the obtained first resistance conversion value, obtain a second resistance conversion value by converting the calculated resistance comparison value according to the second resistance conversion criterion, and change the discharge termination voltage according to the obtained second resistance conversion value.

The control unit may be configured to change the preset resistance conversion criterion only when the determined second degradation acceleration degree is accelerated degradation and at least one of the C-rate and the discharge termination voltage is changed.

After the preset resistance conversion criterion is changed, the control unit may be configured to restore the preset resistance conversion criterion into a resistance conversion criterion before the change only when the second degradation acceleration degree is determined as linear degradation or decelerated degradation.

A battery pack according to another aspect of the present disclosure may comprise the battery management apparatus according to an embodiment of the present disclosure.

Advantageous Effects

According to an aspect of the present disclosure, since not only the degradation degree of the battery cell but also the degradation pattern of the battery cell is estimated, the present state of the battery cell may be more accurately estimated.

In addition, according to one aspect of the present disclosure, since the control condition optimized for each battery cell is set according to the degradation pattern of the battery cell, it is possible to prevent rapid degradation of the battery cell and secure a long life span of the battery cell.

In addition, according to one aspect of the present disclosure, since the degradation pattern of the battery cell is estimated through various indexes, there is an advantage that the battery degradation degree may be more accurately determined.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
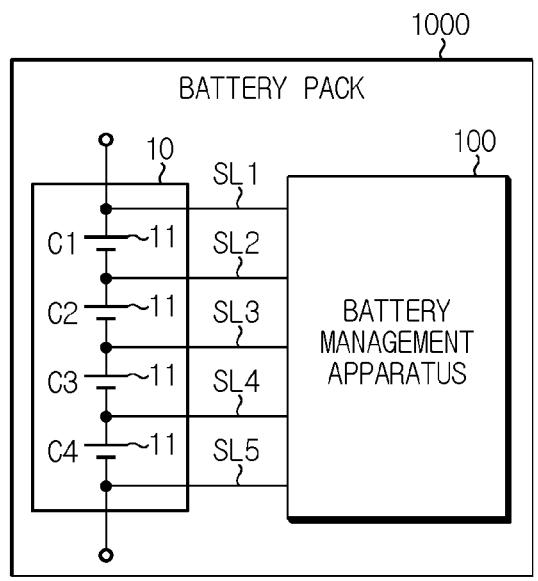
FIG. 1 is a diagram schematically showing a battery pack including a battery management apparatus according to an embodiment of the present disclosure.

FIG. 1 is a diagram schematically showing a battery pack including a battery management apparatus according to an embodiment of the present disclosure.

Referring to FIG. 1, a battery management apparatus 100 according to an embodiment of the present disclosure may be electrically connected to a battery module 10 including a plurality of battery cells 11 to manage each battery cell 11. Namely, the battery management apparatus 100 may estimate a state of the plurality of battery cells 11 included in the battery module 10 and adjust a control condition for each battery cell 11 based on the estimated state. In addition, the battery management apparatus 100 may be included in a battery pack 1000 together with the battery module 10. FIG. 1 shows an example in which one battery module 10 and one battery management apparatus 100 are included in the battery pack 1000, but the number of battery modules 10 and battery management apparatuses 100 included in the battery pack 1000 is not limited to that of FIG. 1. Similarly, the number of battery cells 11 included in the battery module 10 is not limited to that of FIG. 1.

Figure 2:
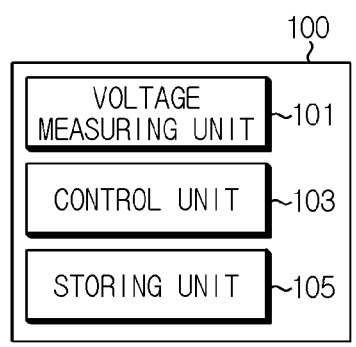
FIG. 2 is a block diagram schematically showing the battery management apparatus according to an embodiment of the present disclosure.

The specific configuration of the battery management apparatus 100 will be described with reference to FIG. 2. FIG. 2 is a block diagram schematically showing the battery management apparatus according to an embodiment of the present disclosure. Hereinafter, first, the process for the battery management apparatus 100 to change a control condition preset for the battery cell 11 based on a voltage increase and decrease pattern of the battery cell 11 will be described.

Referring to FIG. 2, the battery management apparatus 100 may include a voltage measuring unit 101 and a control unit 103.

The voltage measuring unit 101 may measure a voltage of the battery cell 11 included in the battery module 10. That is, the voltage measuring unit 101 may be configured to measure the voltage of each battery cell 11 included in the battery module 10. Preferably, the voltage measuring unit 101 may measure a discharge voltage of the battery cell 11.

For example, in the embodiment shown in FIG. 1, the battery management apparatus 100 may measure a voltage when a first battery cell C1, a second battery cell C2, a third battery cell C3 and a fourth battery cell C4 included in the battery module 10 are discharged, respectively. Specifically, the voltage measuring unit 101 may measure the voltage of the first battery cell C1 through a first sensing line SL1 and a second sensing line SL2, and measure the voltage of the second battery cell C2 through the second sensing line SL2 and a third sensing line SL3. In addition, the voltage measuring unit 101 may measure the voltage of the third battery cell C3 through the third sensing line SL3 and a fourth sensing line SL4, and measure the voltage of the fourth battery cell C4 through the fourth sensing line SL4 and a fifth sensing line SL5.

The voltage measuring unit 101 may measure an open circuit voltage (OCV) of the battery cell 11. That is, the voltage measuring unit 101 may measure both the voltage and the OCV of the battery cell 11. In particular, the voltage measuring unit 101 may measure the OCV of each battery cell 11 whenever the measured voltage reaches a reference discharge voltage. Here, the reference discharge voltage may be a voltage that is preset and stored by a user or the like so that the voltage measuring unit 101 may measure the OCV by using the same. That is, the reference discharge voltage is a reference value by which the OCV of the battery cell 11 may be measured by the voltage measuring unit 101, and may provide a time point when the voltage measuring unit 101 should measure the OCV of the battery cell 11. For example, the predetermined voltage may be set as 2.8 V. The voltage measuring unit 101 may measure voltages of the plurality of battery cells 11 and measure the OCVs of the battery cells 11 whenever the measured voltage of each battery cell 11 reaches the predetermined voltage.

For example, in the embodiment shown in FIG. 1, it is assumed that the reference discharge voltage is set as V1 [V] for each battery cell 11. At this time, if the voltage of the first battery cell C1 reaches V1 [V] by discharging, the voltage measuring unit 101 may measure the OCV of the first battery cell C1. Similarly, if the voltages of the second battery cell C2, the third battery cell C3 and the fourth battery cell C4 reach V1 [V], the voltage measuring unit 101 may measure the OCV of the battery cell 11 whose voltage reaches V1 [V].

The control unit 103 may receive the OCV measured by the voltage measuring unit 101. The control unit 103 is configured to exchange electrical signals with the voltage measuring unit 101 inside the battery management apparatus 100, and may receive the measured OCV from the voltage measuring unit 101.

The control unit 103 may calculate a voltage fluctuation rate by comparing the received OCV with a pre-stored reference voltage. Here, the pre-stored reference voltage is a reference value for comparison with the OCV measured by the voltage measuring unit 101, and may be a value stored in advance. For example, the pre-stored reference voltage may include an OCV of the battery cell 11 measured at a predetermined cycle time point. The voltage fluctuation rate may be obtained by comparing the pre-stored reference voltage with the OCV received from the voltage measuring unit 101 by the control unit 103. In particular, the voltage fluctuation rate may be calculated as a ratio or difference of the pre-stored reference voltage and the measured value of OCV. That is, the control unit 103 may receive the OCV measured at a cycle after the predetermined cycle time point from the voltage measuring unit 101, and calculate the ratio of the received OCV to the pre-stored reference voltage as a voltage fluctuation rate.

For example, it is assumed that the reference voltage pre-stored for the first battery cell C1 is A1 [V]. In addition, it is assumed that the OCV of the first battery cell C1 measured at a first time point by the voltage measuring unit 101 is B1 [V]. The control unit 103 may calculate the voltage fluctuation rate of the first battery cell C1 at the first time point as a ratio of B1 to A1. For example, the voltage fluctuation rate of the first battery cell C1 at the first time point may be calculated using the calculation formula of "(B1÷A1)×100".

The control unit 103 may determine the voltage increase and decrease pattern based on the calculated voltage fluctuation rate and pre-stored voltage fluctuation rate data. Here, the voltage fluctuation rate data is reference data for comparison with the calculated voltage fluctuation rate, and may be stored in advance. The control unit 103 may update the pre-stored voltage fluctuation rate data by adding the calculated voltage fluctuation rate to the pre-stored voltage fluctuation rate data. In addition, the control unit 103 may determine the voltage increase and decrease pattern based on the updated voltage fluctuation rate data.

For example, the pre-stored voltage fluctuation rate data may be data in which a voltage fluctuation rate previously calculated by the control unit 103 is stored. In this case, the control unit 103 may determine the voltage increase and decrease pattern of the battery cell 11 based on all voltage fluctuation rates calculated from the cycle at which the reference voltage is calculated. The voltage increase and decrease pattern may include various patterns such as a voltage increase pattern, a voltage decrease pattern and a voltage constant pattern. Hereinafter, for convenience of description, it will be described that the voltage increase and decrease pattern includes a voltage increase pattern and a voltage decrease pattern, and the voltage increase pattern includes patterns such as a voltage constant pattern excluding the voltage decrease pattern.

The control unit 103 may be configured to determine a first degradation acceleration degree of the battery cell 11 according to the voltage increase and decrease pattern of the battery cell 11. In particular, the control unit 103 may be configured to determine the first degradation acceleration degree of the battery cell 11 according to the voltage increase and decrease pattern of the battery cell 11. Here, the first degradation acceleration degree may be information indicating whether the degradation of the battery cell 11 is getting faster or slower. In addition, the first degradation acceleration degree may be a degradation acceleration degree of the battery cell 11 determined by the control unit 103 according to the voltage increase and decrease pattern. That is, the control unit 103 may determine the voltage increase and decrease pattern for the battery cell 11, and determine the first degradation acceleration degree of the battery cell 11 based on the determined voltage increase and decrease pattern.

For example, in the embodiment of FIG. 1, the control unit 103 may determine the voltage increase and decrease pattern of the first battery cell C1, and determine the first degradation acceleration degree of the first battery cell C1 according to the determined voltage increase and decrease pattern.

The control unit 103 may be configured to change the preset control condition based on the received OCV and the determined first degradation acceleration degree. That is, if the first degradation acceleration degree of the battery cell 11 is determined according to the voltage increase and decrease pattern, the control unit 103 may change the control condition preset for the battery cell 11 based on the determined first degradation acceleration degree of the battery cell 11 and the received OCV of the battery cell 11 at the present cycle. Here, the preset control condition may be set in advance for each battery cell 11. For example, the preset control condition may be set in advance when the battery cell 11 is shipped or first operated. That is, the preset control condition may be set for each of the first battery cell C1, the second battery cell C2, the third battery cell C3 and the fourth battery cell C4.

For example, in the embodiment of FIG. 1, the control unit 103 may determine the first degradation acceleration degree of the first battery cell C1 according to the voltage increase and decrease pattern of the first battery cell C1, and change the control condition preset for the first battery cell C1 according to the OCV of the first battery cell C1 at the present cycle received from the voltage measuring unit 101. In addition, the control unit 103 may determine the first degradation acceleration degree of the second battery cell C2 according to the voltage increase and decrease pattern of the second battery cell C2, and change the control condition preset for the second battery cell C2 according to the OCV of the second battery cell C2 at the present cycle received from the voltage measuring unit 101. Similarly, for the third battery cell C3 and the fourth battery cell C4, the control unit 103 may change the control condition preset for each of the third battery cell C3 and the fourth battery cell C4, based on the determined first degradation acceleration degree and the received OCV.

The battery management apparatus 100 according to an embodiment of the present disclosure may change the control condition preset for the battery cell 11 based on the first degradation acceleration degree of the battery cell 11 and the OCV at the present cycle. Therefore, since the battery management apparatus 100 according to an embodiment of the present disclosure accurately measures the present state of the battery cell 11, it is possible to take action to change the control condition of the battery cell 11 so that the life of the battery cell 11 lasts longer. Therefore, the battery management apparatus 100 may control the charging of the battery cell 11 by optimizing the control conditions set for the battery cell 11, so that the battery cell 11 is not overdischarged.

The control unit 103 may determine the first degradation acceleration degree of the battery cell 11 as any one of accelerated degradation, linear degradation and decelerated degradation according to the voltage increase and decrease pattern of the battery cell 11. Here, the accelerated degradation refers to a state in which the degradation of the battery cell 11 is gradually accelerated, and the linear degradation refers to a state in which the degradation of the battery cell 11 is not gradually accelerated like the accelerated degradation but is performed linearly. Conversely, the decelerated degradation refers to a state in which the degradation of the battery cell 11 is performed gradually slowly.

In particular, the control unit 103 may independently determine the degradation acceleration degree of each battery cell 11. For example, in the embodiment of FIG. 1, the control unit 103 may separately determine the voltage increase and decrease patterns of the first battery cell C1, the second battery cell C2, the third battery cell C3 and the fourth battery cell C4. In addition, the control unit 103 may separately determine the first degradation acceleration degree of each of the first battery cell C1, the second battery cell C2, the third battery cell C3 and the fourth battery cell C4 according to the determined voltage increase and decrease pattern.

That is, since the battery management apparatus 100 according to an embodiment of the present disclosure may independently determine the first degradation acceleration degree of each battery cell 11, it is possible to determine the first degradation acceleration degree of each battery cell 11, also predict the life of each battery cell 11. Specifically, the battery management apparatus 100 may calculate the degradation degree of each battery cell 11 by measuring the OCV of each battery cell 11 to calculate a loss capacity, and also may determine the first degradation acceleration degree about how quickly each battery cell 11 is degraded. Accordingly, the battery management apparatus 100 may estimate a future degradation degree of each battery cell 11 according to the first degradation acceleration degree of the battery cell 11.

For example, even battery cells 11 of the same product line may not have exactly the same available capacity due to problems such as initial resistance variation or capacity variation. For example, it is assumed that the battery cells have a factory setting capacity of 1000 mAh, but the first battery cell C1 has an initial capacity of 900 mAh, and the second battery cell C2 has an initial capacity of 1000 mAh. If the present available capacities of the first battery cell C1 and the second battery cell C2 become equal to 800 mAh due to the use during the same period, even though the first battery cell C1 and the second battery cell C2 have the same available capacity, it is not accurate estimation of the state of the battery cell 11 to determine that both battery cells 11 have the same degradation degree due to the difference in initial capacity. In addition, even though the degradation degree of the first battery cell C1 is calculated to be about 11% and the degradation degree of the second battery cell C2 is calculated to be 20%, the calculated degradation degree is only meaningful as an index indicating only a present state of each of the first battery cell C1 and the second battery cell C2 according to the present capacity compared to the initial capacity, and is not suitable as an index for predicting a present first degradation acceleration degree of each of the first battery cell C1 and the second battery cell C2 or a future situation such as an expected lifetime according to the first degradation acceleration degree. That is, the ratio of the present capacity to the initial capacity of the battery cell 11 is only an index for ex post determination of the deterioration degree of the battery cell 11, and it is not suitable as an index for determining the first degradation acceleration degree, the future deterioration rate, or the expected lifespan of the battery cell 11.

Meanwhile, the battery management apparatus 100 according to an embodiment of the present disclosure has an advantage of accurately determining a present state of the battery cell 11 by measuring the present OCV of the battery cell 11 and determining the first degradation acceleration degree. In addition, the battery management apparatus 100 has an advantage of setting a control condition optimized for the battery cell 11, based on the determined present state of the battery cell 11.

Here, the control unit 103 may optionally include a processor, an application-specific integrated circuit (ASIC), another chipset, a logic circuit, a register, a communication modem, and a data processing device, and the like, known in the art to execute various control logics performed in the battery management apparatus 100 according to an embodiment of the present disclosure. In addition, when the control logic is implemented in software, the control unit 103 may be implemented as a set of program modules. At this time, the program module may be stored in a memory and executed by the processor. The memory may be provided in or out of the processor, and may be connected to the processor by various well-known means. For example, the control unit 103 is a processor provided in the battery management apparatus 100 according to an embodiment of the present disclosure, and may provide the state information including the determined first degradation acceleration degree of the battery cell 11 and the control conditions preset for the battery cell 11 to a user through an output device such as a display device. In addition, the control unit 103 may provide a notification for replacement or warning of the battery cell 11 to the user through an external notification device based on the state information and the control conditions of the battery cell 11.

In addition, referring to FIG. 2, the battery management apparatus 100 according to an embodiment of the present disclosure may further include a storing unit 105. The storing unit 105 may store the reference voltage. That is, the reference voltage is stored in the storing unit 105 in advance, and the control unit 103 may calculate a voltage fluctuation rate by comparing the reference voltage pre-stored in the storing unit 105 with the OCV received from the voltage measuring unit 101. In addition, the storing unit 105 may store the voltage fluctuation rate data. That is, the voltage fluctuation rate data calculated in the past by the control unit 103 is stored in the storing unit 105, and the control unit 103 may determine the voltage increase and decrease pattern of the battery cell 11 based on the voltage fluctuation rate data pre-stored in the storing unit 105.

That is, the storing unit 105 may store data or programs required for each component of the battery management apparatus 100 according to an embodiment of the present disclosure to operate and perform, such as the reference voltage measured by the voltage measuring unit 101 and the previous voltage fluctuation rate data calculated by the control unit 103. The storing unit 105 is not particularly limited in its kind as long as it is a known information storage means that may record, erase, update and read data. As an example, the information storage means may include a random-access memory (RAM), a flash memory, a read-only memory ROM, an electrically erasable programmable read-only memory (EEPROM), a register, and the like. The storing unit 105 may store program codes in which processes executable by the control unit 103 are defined.

Preferably, the pre-stored reference voltage may include an OCV when the battery cell 11 is discharged at a predetermined cycle so that the voltage of the battery cell 11 reaches the reference discharge voltage. Here, the predetermined cycle may be a time point within a predetermined number of cycles from BOL (Beginning Of Life), and, for example, may be a first discharge time point after shipment of the battery cell 11.

For example, it is assumed that the reference discharge voltage is set to 2.8 V. In this case, the voltage measuring unit 101 may measure a voltage in an initial discharge process (an initial state) of the first battery cell C1, and measure an OCV when the measured voltage reaches 2.8 V.

Preferably, the pre-stored voltage fluctuation rate data may be configured to include a voltage fluctuation rate calculated by the control unit 103 whenever OCV is measured by the voltage measuring unit 101. That is, from the predetermined cycle to the present time point, the voltage measuring unit 101 may measure OCV when the voltage of the battery cell 11 reaches the reference discharge voltage by discharging, and the control unit 103 may calculate a voltage fluctuation rate according to the OCV measured by the voltage measuring unit 101. In addition, the calculated voltage fluctuation rate may be included in the voltage fluctuation rate data pre-stored in the storing unit 105.

For example, in the embodiment of FIG. 1, the pre-stored voltage fluctuation rate data for the first battery cell C1 may include voltage fluctuation rates of the first battery cell C1 calculated from a first time point to an N-$1^{th}$ time point. Here, N is an integer of 2 or more, and when N is 2, the pre-stored voltage fluctuation rate data may include only the voltage fluctuation rate of the first battery cell C1 calculated at the first time point. If the voltage fluctuation rate of the first battery cell C1 is calculated at the $N^{th}$ time point by the control unit 103, the voltage fluctuation rate of the first battery cell C1 at the $N^{th}$ time point may be included in the voltage fluctuation rate data pre-stored in the storing unit 105. In this case, the voltage fluctuation rate data pre-stored in the storing unit 105 may include first to $N^{th}$ voltage fluctuation rates.

The battery management apparatus 100 according to an embodiment of the present disclosure may determine a present voltage increase and decrease pattern of the battery cell 11 based on the voltage fluctuation rate data pre-stored in the storing unit 105 from the past time point to the present time point. That is, since the battery management apparatus 100 according to an embodiment of the present disclosure determines the voltage increase and decrease pattern and the first degradation acceleration degree of the battery cell 11 at the present based on the pre-stored voltage fluctuation rate data in which the calculated voltage fluctuation rates are accumulatively stored, there is an advantage in that the degradation acceleration degree and the degradation degree of the battery cell 11 may be more accurately determined, compared to the case where the degradation degree of the battery cell 11 is determined only by the voltage fluctuation rate at a specific time point. In addition, since the determined first degradation acceleration degree and the determined degradation degree may be utilized as information for estimating a future state of the battery cell 11, the battery management apparatus 100 according to an embodiment of the present disclosure has an advantage of providing information capable of estimating a future state based on not only the past and present states but also the degradation acceleration degree of the battery cell 11.

The control unit 103 may calculate a rate of voltage change between a plurality of voltage fluctuation rates included within a predetermined number of cycles from the present cycle of the battery cell 11 among the pre-stored voltage fluctuation rate data and the calculated voltage fluctuation rate. Here, the rate of voltage change may include an average rate of change or an instantaneous rate of change of the voltage fluctuation rates. In addition, the plurality of voltage fluctuation rates included within a predetermined number of cycles from the present cycle may include a plurality of voltage fluctuation rates included within a preset number of cycles from the present cycle. For example, the control unit 103 may calculate a rate of voltage change of a plurality of voltage fluctuation rates included within 50 cycles from the present cycle. The calculation of the rate of voltage change will be described in detail with reference to FIGS. 3 and 4.

Figure 3:
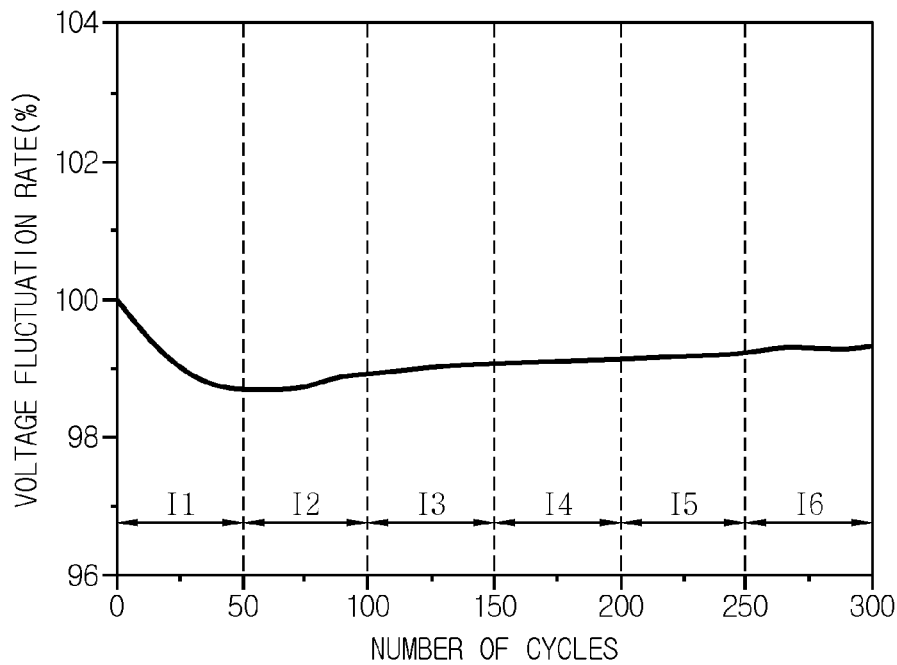
FIG. 3 is a diagram showing a voltage fluctuation rate of a first battery cell, calculated by the battery management apparatus according to an embodiment of the present disclosure.
Figure 4:
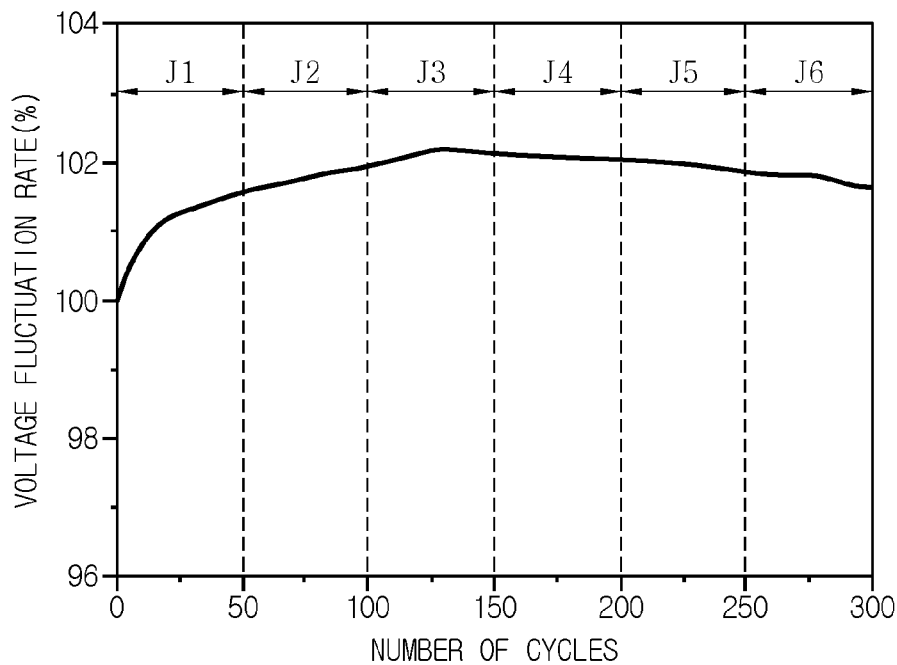
FIG. 4 is a diagram showing a voltage fluctuation rate of a second battery cell, calculated by the battery management apparatus according to an embodiment of the present disclosure.

FIG. 3 is a diagram showing a voltage fluctuation rate of the first battery cell, calculated by the battery management apparatus 100 according to an embodiment of the present disclosure. FIG. 4 is a diagram showing a voltage fluctuation rate of the second battery cell, calculated by the battery management apparatus 100 according to an embodiment of the present disclosure.

Referring to FIGS. 3 and 4, the storing unit 105 may store voltage fluctuation rate data pre-stored for the first battery cell C1 and voltage fluctuation rate data pre-stored for the second battery cell C2 at every cycle. Hereinafter, as shown in FIG. 3, a region including a preset number of cycles for the first battery cell C1 will be described as an In region. Similarly, as shown in FIG. 4, a region including a preset number of cycles for the second battery cell C2 will be described as a Jn region. Here, n is a positive integer. For example, if the preset number of cycles is 50, an I1 region may include 0 to 50 cycles of the first battery cell C1, and an I2 region may include 51 to 100 cycles of the first battery cell C1. For convenience of description, it is assumed that 0 cycle of the first battery cell C1 is included in IL and 0 cycle of the second battery cell C2 is included in the J1 region.

For example, it is assumed that a preset number of cycles to be included in one region is 50. In FIG. 3, if the present cycle of the first battery cell C1 is 300 cycle, the control unit 103 may extract a voltage fluctuation rate of each cycle belonging to an I6 region including 251 to 300 cycles of the voltage fluctuation rate data pre-stored in the storing unit 105 for the first battery cell C1. That is, the control unit 103 may calculate a rate of voltage change of the I6 region by comparing the voltage fluctuation rate of every cycle belonging to the I6 region of the first battery cell C1 with each other. Similarly, in FIG. 4, if the present cycle of the second battery cell C2 is 150 cycle, the control unit 103 may extract a voltage fluctuation rate of every cycle belonging to the J3 region including 101 to 150 cycles of the voltage fluctuation rate data pre-stored in the storing unit 105 for the second battery cell C2. The control unit 103 may calculate a rate of voltage change of the J3 region by comparing the voltage fluctuation rate of every cycle belonging to the J3 region of the second battery cell C2 with each other. Here, the rate of voltage change means a specific value for the rate of change.

Hereinafter, for convenience of description, it will be assumed that the rate of voltage change is a positive change rate if it is equal to or greater than 0 and the rate of voltage change is a negative change rate if it is smaller than 0. In addition, an example in which the control unit 103 calculates a rate of voltage change will be described in detail with reference to FIG. 5.

Figure 5:
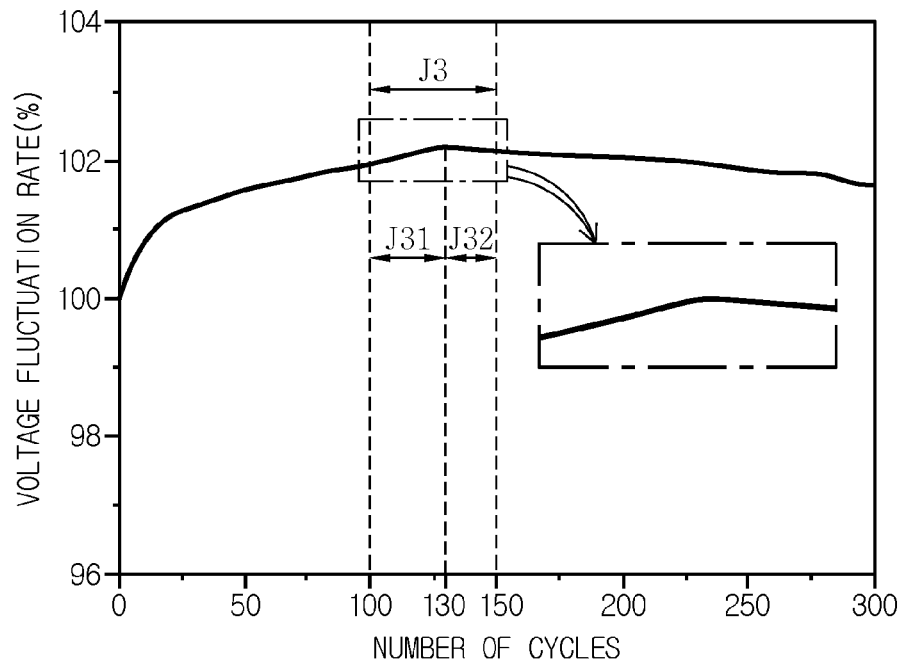
FIG. 5 is an enlarged view showing a region of the voltage fluctuation rate of the second battery cell, calculated by the battery management apparatus according to an embodiment of the present disclosure.

FIG. 5 is an enlarged view showing a region of the voltage fluctuation rate of the second battery cell, calculated by the battery management apparatus according to an embodiment of the present disclosure. That is, FIG. 5 is an enlarged view showing a voltage fluctuation rate included in the J3 region among voltage fluctuation rates calculated for the second battery cell C2.

Referring to the embodiment of FIG. 5, the control unit 103 may calculate a rate of voltage change of a voltage fluctuation rates included in a region to which the present cycle of the battery cell 11 belongs. At this time, the control unit 103 may divide the region to which the present cycle of the battery cell 11 belongs into a plurality of sub regions based on the rate of voltage change of the region to which the present cycle of the battery cell 11 belongs. Specifically, the control unit 103 may divide a single region into a plurality of sub regions based on a cycle at which the rate of voltage change calculated in one region changes from a positive change rate to a negative change rate or from a negative change rate to a positive change rate. For example, in the embodiment of FIG. 5, the control unit 103 may calculate an average rate of change for successive cycles included in the J3 region or an instantaneous rate of change for successive cycles included in the J3 region. Specifically, based on 130 cycle, the rate of voltage change of the J31 region may be calculated as a positive change rate, and the rate of voltage change of the J32 region may be calculated as a negative change rate. Accordingly, the control unit 103 may divide the J3 region of the second battery cell C2 into the J31 region and the J32 region based on 130 cycle.

That is, in the embodiment of FIG. 5, the control unit 103 may divide the J3 region into J31 and J32 regions and calculate the rate of voltage change for each of the J31 region and the J32 region. As such, the control unit 103 may divide one region into sub regions and calculate a rate of voltage change for each sub region.

When calculating a rate of change between voltage fluctuation rates included in a region to which the present cycle of the battery cell 11 belongs, the control unit 103 may not calculate the rate of change by regarding the region to which the present cycle belongs as just a single region. In addition, the control unit 103 may determine a cycle time point at which the rate of voltage change changes from positive to negative or from negative to positive, and divide the region to which the present cycle of the battery cell 11 belongs into sub regions based on the determined cycle time point.

As described above, the battery management apparatus 100 according to an embodiment of the present disclosure does not determine that the region to which the present cycle of the battery cell 11 belongs is only one region indiscriminately, and if necessary, the battery management apparatus 100 divides the region into sub regions and calculates a rate of voltage change in more detail, and thus there is an advantage in that the present state of the battery cell 11 may be more accurately determined.

In addition, the control unit 103 may determine a voltage increase and decrease pattern based on the calculated rate of voltage change. Here, the voltage increase and decrease pattern may include a voltage increase pattern and a voltage decrease pattern. In particular, the control unit 103 may determine the voltage increase and decrease pattern as a voltage increase pattern if the calculated rate of change is a positive change rate. In addition, the control unit 103 may determine the voltage increase and decrease pattern as a voltage decrease pattern if the calculated rate of change is a negative change rate.

For example, referring to FIG. 3, if the present cycle of the first battery cell C1 belongs to the I1 region, the control unit 103 may calculate the rate of voltage change of the first battery cell C1 based on the voltage fluctuation rate included in the I1 region. In this case, the control unit 103 may calculate the rate of voltage change of the I1 region as a value less than zero. That is, the rate of voltage change of the I1 region may be calculated as a negative change rate. In addition, the control unit 103 may determine the present voltage increase and decrease pattern of the first battery cell C1 as a voltage decrease pattern based on the result that the rate of voltage change is calculated as a negative change rate. In addition, if the present cycle of the first battery cell C1 belongs to any one of the I2 to I6 regions, the control unit 103 may calculate a positive change rate based on the voltage fluctuation rate included in the corresponding region. Also, the control unit 103 may determine the present voltage increase and decrease pattern of the first battery cell C1 as a voltage increase pattern based on the calculated positive change rate.

For example, referring to FIG. 4, if the present cycle of the second battery cell C2 belongs to the J2 region, the control unit 103 may calculate a rate of voltage change based on the voltage fluctuation rate included in the J2 region. At this time, the control unit 103 may calculate the rate of voltage change of the J2 region as a value of 0 or above. That is, the rate of voltage change of the J2 region may be calculated as a positive change rate. In addition, the control unit 103 may determine the present voltage increase and decrease pattern of the second battery cell C2 as a voltage increase pattern based on the calculated rate of voltage change of the J2 region.

If the present cycle of the second battery cell C2 belongs to the J3 region, as shown in FIG. 5, the control unit 103 may divide the J3 region into a J31 region and a J32 region and calculate a rate of voltage change of each of the J31 region and the J32 region. The control unit 103 may calculate the rate of voltage change of the J31 region as a value of 0 or above and calculate the rate of voltage change of the J32 region as a value smaller than 0. That is, the rate of voltage change of the J31 region may be calculated as a positive change rate, and the rate of voltage change of the J32 region may be calculated as a negative change rate. In addition, the control unit 103 may determine the voltage increase and decrease pattern of the J31 region as a voltage increase pattern and determine the voltage increase and decrease pattern of the J32 region as a voltage decrease pattern based on the calculated rate of voltage change.

That is, the battery management apparatus 100 according to an embodiment of the present disclosure has an advantage of more accurately estimating a present state of the battery cell 11 in consideration of not only the present state of the battery cell 11 but also the previous state. In addition, since the battery management apparatus 100 according to an embodiment of the present disclosure calculates the rate of voltage change of the battery cell 11 and determines the voltage increase and decrease pattern based on the rate of voltage change, there is an advantage of providing information from which a future state of the battery cell 11 may be easily estimated. In addition, even within a predetermined number of cycles from the present cycle, the voltage increase and decrease pattern of the battery cell 11 may be determined more specifically and concretely by dividing the region in which the rate of voltage change varies from negative to positive or from positive to negative into sub regions, and thus it is possible to more accurately estimate the present state of the battery cell 11.

Preferably, the control unit 103 may be configured to determine the voltage increase and decrease pattern of the battery cell 11 only when the voltage fluctuation rate calculated for the battery cell 11 is greater than a preset lower voltage limit and smaller than a preset upper voltage limit. That is, the control unit 103 may determine the voltage increase and decrease pattern only when the voltage fluctuation rate of the battery cell 11 is within a certain range. For example, if the voltage fluctuation rate of the battery cell 11 is greater than or equal to the preset upper limit, this refers to a case where the OCV of the battery cell 11 increases to a reference value or above, at which the battery cell 11 may be abnormally degraded and have a sudden drop risk. In addition, if the voltage fluctuation rate of the battery cell 11 is smaller than or equal to the preset lower limit, this refers to a case where the OCV of the battery cell 11 decreases to a reference value or below due to an electric short circuit or the like and the battery cell 11 may be abnormally degraded. Therefore, the control unit 103 may determine the voltage increase and decrease pattern for the case where the battery cell 11 is normally degraded, except for the case where the battery cell 11 is degraded abnormally.

If the normal or abnormal state of the battery cell 11 is not distinguished in advance, the first degradation acceleration degree may be determined according to the voltage increase and decrease pattern in an abnormal state, and the battery control condition may be adjusted according to the determined first degradation acceleration degree, which may further deteriorate the state of the battery cell 11. Accordingly, since the battery management apparatus 100 according to an embodiment of the present disclosure first divides the state of the battery cell 11 into a normal state or an abnormal state and then determines the voltage increase and decrease pattern and the first degradation acceleration degree only when the state of the battery cell 11 is a normal state, it is possible to shorten the time required for determining the first degradation acceleration degree of the battery cell 11 and to improve the accuracy of determining the state of the battery cell 11. Further, the battery management apparatus 100 has an advantage of maintaining an optimal state of the battery cell 11 by changing the control condition preset for the battery cell 11 based on the accurately determined first degradation acceleration degree of the battery cell 11.

Hereinafter, the process for the control unit 103 to determine the voltage increase and decrease pattern, determine the first degradation acceleration degree according to the determined voltage increase and decrease pattern, and change the control condition preset for the battery cell 11 based on the determined first degradation acceleration degree will be described in more detail.

The control unit 103 may be configured to determine the first degradation acceleration degree of the battery cell 11 as any one of accelerated degradation and linear degradation only when the voltage increase and decrease pattern is determined as a voltage increase pattern.

For example, in the embodiment of FIG. 3, if the present cycle of the first battery cell C1 belongs to the I2 region, the control unit 103 may determine the voltage increase and decrease pattern of the first battery cell C1 as the voltage increase pattern as in the former example. The control unit 103 may determine the present first degradation acceleration degree of the first battery cell C1 as any one of accelerated degradation and linear degradation according to the rate of voltage change of the I2 region determined as the voltage increase pattern. The rate of voltage change of the I2 region is a positive change rate of 0 or above, and if the present cycle of the first battery cell C1 belongs to the I2 region, the control unit 103 may determine the first degradation acceleration degree of the first battery cell C1 as any one of accelerated degradation and linear degradation.

In addition, in the embodiment of FIG. 4, if the present cycle of the second battery cell C2 belongs to the J2 region, the control unit 103 may determine the voltage increase and decrease pattern of the second battery cell C2 as the voltage increase pattern as in the former example. The control unit 103 may determine the first degradation acceleration degree of the second battery cell C2 as any one of accelerated degradation and linear degradation according to the rate of voltage change of the J2 region determined as the voltage increase pattern. In addition, if the voltage increase and decrease pattern is determined as the voltage decrease pattern, the control unit 103 may be configured to determine the degradation acceleration degree of the battery cell 11 as the decelerated degradation. The rate of voltage change of the J2 region is a positive change rate of 0 or above, and if the present cycle of the second battery cell C2 belongs to the J2 region, the control unit 103 may determine the first degradation acceleration degree of the first battery cell C1 as any one of accelerated degradation and linear degradation.

Also, if the voltage increase and decrease pattern is determined as a voltage decrease pattern, the control unit 103 may be configured to determine the first degradation acceleration degree of the battery cell 11 as the decelerated degradation.

For example, in the embodiment of FIG. 3, if the present cycle of the first battery cell C1 belongs to the I1 region, the control unit 103 may determine the voltage increase and decrease pattern of the first battery cell C1 as the voltage decrease pattern. The control unit 103 may determine the first degradation acceleration degree of the first battery cell C1 as the decelerated degradation according to the rate of voltage change of the I1 region of the first battery cell C1 determined as the voltage decrease pattern. The rate of voltage change of the I1 region is a negative change rate less than 0, and if the present cycle of the first battery cell C1 belongs to the I1 region, the control unit 103 may determine the first degradation acceleration degree of the first battery cell C1 as decelerated degradation.

Similarly, in the embodiment of FIG. 4, if the present cycle of the second battery cell C2 belongs to the J4 region, the control unit 103 may determine the voltage increase and decrease pattern of the second battery cell C2 as the voltage decrease pattern. The control unit 103 may determine the first degradation acceleration degree of the second battery cell C2 as the decelerated degradation according to the rate of voltage change of the J4 region of the second battery cell C2 determined as the voltage decrease pattern. The rate of voltage change of the J4 region is a negative change rate less than 0, and if the present cycle of the second battery cell C2 belongs to the J4 region, the control unit 103 may determine the first degradation acceleration degree of the second battery cell C2 as decelerated degradation.

Since the battery management apparatus 100 according to an embodiment of the present disclosure determines the first degradation acceleration degree of the battery cell 11 in detail as accelerated degradation, linear degradation or decelerated degradation according to the voltage increase and decrease pattern and the rate of voltage change of the battery cell 11, there is an advantage of accurately determining and diagnosing the present state of the battery cell 11. In addition, if the voltage increase and decrease pattern is determined as the voltage decrease pattern, the battery management apparatus 100 may determine the first degradation acceleration degree of the battery cell 11 just as decelerated degradation, and this has an advantage of saving time required to determine the first degradation acceleration degree.

Specifically, among the first degradation acceleration degrees of the battery cell 11, the accelerated degradation and the linear degradation may be distinguished according to how fast the battery cell 11 is degraded. That is, the control unit 103 may be configured to determine the first degradation acceleration degree of the battery cell 11 as the accelerated degradation if the calculated rate of voltage change is greater than or equal to a preset reference rate of voltage change. Conversely, if the calculated rate of voltage change is smaller than the preset reference rate of voltage change, the control unit 103 may be configured to determine the first degradation acceleration degree of the battery cell 11 as the linear degradation. Here, the preset reference rate of voltage change is a reference rate of change for determining the first degradation acceleration degree as any one of accelerated degradation and linear degradation, when the voltage increase and decrease pattern of the battery cell 11 is determined as a voltage increase pattern. In addition, the preset reference rate of voltage change may be stored in the storing unit 105 in advance.

For example, in the embodiment shown in FIGS. 3 and 4, the preset reference rate of voltage change may be preset such that the voltage fluctuation rate increases by 1% at every 50 cycles. For example, in the embodiment shown in FIG. 3, if the present cycle of the first battery cell C1 belongs to any one of the I2, I3, I4, I5 and I6 regions, the control unit 103 may compare the rate of voltage change of the region to which the present cycle of the first battery cell C1 belongs with the preset reference rate of voltage change. Since the rate of voltage change of each of the I2, I3, I4, I5 and I6 regions is smaller than the preset reference rate of voltage change, the control unit 103 may determine the first degradation acceleration degree of the first battery cell C1 as the linear degradation.

Similarly, in the embodiment shown in FIG. 4, if the present cycle of the second battery cell C2 belongs to any one of the J1, J2 and J3 regions, the control unit 103 may compare the rate of voltage change of the region to which the present cycle of the second battery cell C2 belongs with the preset reference rate of voltage change.

Hereinafter, the process of comparing a rate of voltage change of a region to which the present cycle of the second battery cell C2 belongs with the preset reference rate of voltage change will be described in detail with references to FIGS. 4 to 6.

Figure 6:
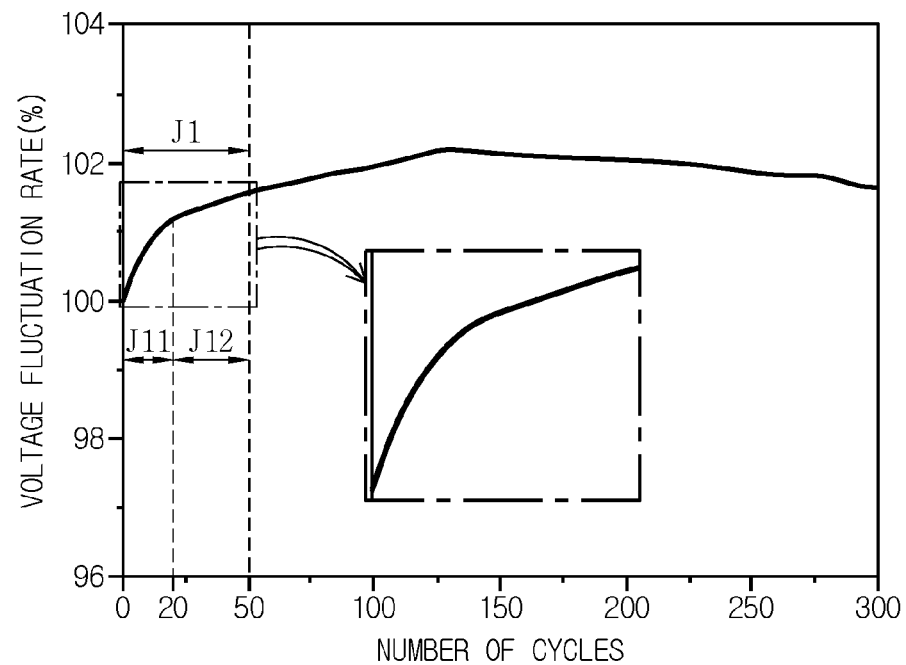
FIG. 6 is an enlarged view showing another region of voltage fluctuation rate of the second battery cell, calculated by the battery management apparatus according to an embodiment of the present disclosure.

FIG. 6 is an enlarged view showing another region of the voltage fluctuation rate of the second battery cell, calculated by the battery management apparatus according to an embodiment of the present disclosure. Namely, FIG. 6 is an enlarged view showing a voltage fluctuation rate included in the J1 region among voltage fluctuation rates calculated for the second battery cell C2.

If the present cycle of the second battery cell C2 belongs to any one of J1, J2 and J31 region, the control unit 103 may compare the rate of voltage change of the region to which the present cycle of the second battery cell C2 belongs with the preset reference rate of voltage change.

Here, the control unit 103 may divide the J1 region into a J11 region and a J12 region based on the rate of voltage change of the J1 region. In the process of calculating the rate of voltage change of the J1 region, the control unit 103 may divide the J1 region into the J11 region and the J12 region based on a point where the rate of voltage change rapidly changes. That is, the control unit 103 may divide one region into a first sub region in which the calculated rate of voltage change is greater than or equal to the preset reference rate of voltage change and a second sub region in which the calculated rate of voltage change is smaller than the preset reference rate of voltage change. Here, it is assumed that the rate of voltage change of the J11 region is greater than the preset reference rate of voltage change, and the rate of voltage change of the J12 region is smaller than the preset reference rate of voltage change. For example, the control unit 103 may divide the J1 region into the J11 and J12 regions based on 20 cycle. That is, the J11 region and the J12 region may be sub regions of the J1 region.

For example, if the present cycle of the second battery cell C2 belongs to the J11 region, the control unit 103 may calculate the rate of voltage change of the J11 region, compare the calculated rate of voltage change with the preset reference rate of voltage change, and determine the first degradation acceleration degree of the second battery cell C2 as the accelerated degradation. Conversely, if the present cycle of the second battery cell C2 belongs to the J12 region, the control unit 103 may calculate the rate of voltage change of the J12 region, compare the calculated rate of voltage change with the preset reference rate of voltage change, and determine the first degradation acceleration degree of the second battery cell C2 as the linear degradation.

That is, the battery management apparatus 100 according to an embodiment of the present disclosure may compare the preset reference rate of voltage change with the rate of voltage change of the region to which the present cycle of the battery cell 11 belongs, and determine the first degradation acceleration degree by subdividing the same into any one of accelerated degradation, linear degradation and decelerated degradation, without indiscriminately determining the first degradation acceleration degree for the voltage increase pattern. Therefore, the present state of the battery cell 11 may be further subdivided and specifically diagnosed.

Preferably, the control unit 103 may be configured to determine the first degradation acceleration degree of the battery cell 11 as any one of accelerated degradation and linear degradation according to the determined rate of voltage change of the voltage increase pattern, only when the voltage increase and decrease pattern is determined as the voltage increase pattern.

For example, as in the former example, referring to FIG. 3, if the present cycle of the first battery cell C1 belongs to the I2 region, the control unit 103 may determine the voltage increase and decrease pattern of the first battery cell C1 as the voltage increase pattern. The control unit 103 may determine the present first degradation acceleration degree of the first battery cell C1 as any one of accelerated degradation and linear degradation according to the rate of voltage change of the I2 region determined as the voltage increase pattern.

Similarly, as in the former example, referring to FIG. 4, if the present cycle of the second battery cell C2 belongs to the J2 region, the control unit 103 may determine the voltage increase and decrease pattern of the second battery cell C2 as the voltage increase pattern. The control unit 103 may determine the first degradation acceleration degree of the second battery cell C2 as any one of accelerated degradation and linear degradation according to the rate of voltage change of the J2 region determined as the voltage increase pattern. In addition, if the voltage increase and decrease pattern is determined as the voltage decrease pattern, the control unit 103 may be configured to determine the first degradation acceleration degree of the battery cell 11 as decelerated degradation.

That is, if the voltage increase and decrease pattern is determined as the voltage decrease pattern, the battery management apparatus 100 according to an embodiment of the present disclosure may determine the first degradation acceleration degree of the battery cell 11 only as decelerated degradation, which has an advantage of saving time required for determining the first degradation acceleration degree.

For example, as in the former example, referring to FIG. 3, if the present cycle of the first battery cell C1 belongs to the I1 region, the control unit 103 may determine the voltage increase and decrease pattern of the first battery cell C1 as the voltage decrease pattern. The control unit 103 may determine the first degradation acceleration degree of the first battery cell C1 as decelerated degradation according to the rate of voltage change of the I1 region of the first battery cell C1 determined as the voltage decrease pattern.

Similarly, as in the former example, referring to FIG. 4, if the present cycle of the second battery cell C2 belongs to the J4 region, the control unit 103 may determine the voltage increase and decrease pattern of the second battery cell C2 as the voltage decrease pattern. The control unit 103 may determine the first degradation acceleration degree of the second battery cell C2 as decelerated degradation according to the rate of voltage change of the J4 region of the second battery cell C2 determined as the voltage decrease pattern.

Since the battery management apparatus 100 according to an embodiment of the present disclosure determines the first degradation acceleration degree of the battery cell 11 in detail as accelerated degradation, linear degradation or decelerated degradation according to the voltage increase and decrease pattern and the rate of voltage change of the battery cell 11, there is an advantage of accurately determining and diagnosing the present state of the battery cell 11.

The preset control condition may include at least one of a C-rate and a discharge termination voltage (Vmin) set for the battery cell 11. The preset control condition is set in advance for the battery cell 11 when the battery cell 11 is shipped or first operated, and may be changed later by the control unit 103 according to the first degradation acceleration degree of the battery cell 11. In addition, the preset control conditions may be stored in the storing unit 105. For example, in the embodiment of FIG. 1, the preset control condition may be set for each of the first battery cell C1, the second battery cell C2, the third battery cell C3 and the fourth battery cell C4.

In addition, the control unit 103 may set the OCV of the battery cell 11 measured in advance at the start cycle of the determined voltage increase and decrease pattern as a reference OCV only when the determined first degradation acceleration degree is any one of accelerated degradation and linear degradation. That is, if the determined first degradation acceleration degree is decelerated degradation, the control unit 103 may not set the reference OCV.

First, the control unit 103 may determine the voltage increase and decrease pattern of the battery cell 11, and determine the first degradation acceleration degree according to the determined voltage increase and decrease pattern. In addition, if the first degradation acceleration degree is any one of accelerated degradation and linear degradation, the control unit 103 may select a start cycle of the determined voltage increase and decrease pattern. Here, the start cycle may be a starting point of a voltage increase and decrease pattern that is continued from and identical to the present voltage increase and decrease pattern of the battery cell 11 determined by the control unit 103. That is, the control unit 103 may select a best region determined as a voltage increase and decrease pattern identical to the voltage increase and decrease pattern of the region to which the present cycle of the battery cell 11 belongs, among consecutive regions before the region to which the present cycle of the battery cell 11 belongs. In addition, the control unit 103 may select a start cycle of the selected best region.

For example, if the first degradation acceleration degree of the battery cell 11 after 0 cycle is determined as any one of accelerated degradation and linear degradation and the voltage increase and decrease pattern of the battery cell 11 is entirely determined as a voltage increase pattern, the start cycle of the voltage increase pattern may be 0 cycle. As another example, if the voltage increase and decrease pattern of the battery cell 11 at 0 cycle to 100 cycle is determined as a voltage decrease pattern and the voltage increase and decrease pattern of the battery cell 11 at 101 cycle to the present cycle is determined as a voltage increase pattern, the start cycle of the voltage increase pattern may be 101 cycle. After the start cycle is selected, the control unit 103 may set the OCV of the battery cell 11 measured at the selected start cycle as a reference OCV.

For example, in the embodiment shown in FIG. 3, it is assumed that the present cycle of the first battery cell C1 belongs to the I6 region, the voltage increase and decrease pattern of the I1 region is a voltage decrease pattern, and the voltage increase and decrease patterns of the I2 to I6 regions are all a voltage increase pattern. For convenience of explanation, even though the voltage increase and decrease patterns of the I2 to I6 regions are assumed as a voltage increase pattern, the process for the control unit 103 to determine the voltage increase and decrease pattern of each region will be described later. The control unit 103 may select a best region in which the voltage increase and decrease pattern is determined as a voltage increase and decrease pattern identical to the voltage increase and decrease pattern of the I6 region, among the consecutive regions before the I6 region to which the present cycle of the first battery cell C1 belongs. In this case, among the regions before the I6 region, regions consecutive to the I6 region among regions before the region I6 are I1 to I5 regions. In addition, the voltage increase and decrease patterns of the I2 to I5 regions are voltage increase patterns identical to the voltage increase and decrease pattern of the I6 region, among the I1 to I5 regions. Therefore, the control unit 103 may select the I2 region as the best region. In addition, the control unit 103 may set the OCV of the first battery cell C1 measured in the start cycle of the I2 region as a reference OCV.

In addition, the control unit 103 may calculate a voltage comparison value by comparing the set reference OCV with the OCV received from the voltage measuring unit 101. For example, if the reference OCV is 2.8 V and the OCV received from the voltage measuring unit 101 is 2.81 V, the control unit 103 may calculate 0.01 V as the voltage comparison value.

For example, as in the former example, in the embodiment shown in FIG. 3, it is assumed that the present cycle of the first battery cell C1 belongs to the I6 region, the voltage increase and decrease pattern of the I1 region is a voltage decrease pattern, and the voltage increase and decrease patterns of the I2 to I6 regions are all voltage increase patterns. The control unit 103 may compare the OCV of the first battery cell C1 measured at the start cycle of the I2 region, namely the reference OCV, with the OCV measured at the present cycle of the first battery cell C1. The control unit 103 may calculate the difference between the reference OCV and the OCV of the first battery cell C1 measured at the present cycle as the voltage comparison value.

In addition, the control unit 103 may be configured to change at least one of the C-rate and the discharge termination voltage based on a voltage conversion value obtained by converting the calculated voltage comparison value according to a preset voltage conversion criterion. Here, the preset voltage conversion criterion may be stored in the storing unit 105. That is, the control unit 103 may change the control condition preset for the battery cell 11 by converting the calculated voltage comparison value into a conversion value corresponding to the C-rate or the discharge termination voltage and changing the C-rate or the discharge termination voltage according to the conversion value.

For example, the control unit 103 may calculate a voltage comparison value that is the difference between the reference OCV and the present OCV of the battery cell 11, calculate a conversion value obtained by converting the calculated voltage comparison value according to the preset conversion criterion, and reduce the C-rate of the battery cell 11 according to the calculated conversion value. For example, whenever the present OCV of the battery cell 11 decreases by 5 mV from the reference OCV, the control unit 103 may reduce the C-rate of the battery cell 11 by 1% from an initially set C-rate. Here, the initially set C-rate may be set for each battery cell 11 and stored in the storing unit 105 in advance.

As another example, the control unit 103 may calculate a voltage difference between the reference OCV and the present OCV of the battery cell 11, and raise the discharge termination voltage of the battery cell 11 based on the calculated voltage difference. For example, whenever the present OCV of the battery cell 11 increases by 1 mV from the reference OCV, the control unit 103 may increase the discharge termination voltage of the battery cell 11 by 1 mV from an initially set discharge termination voltage. Here, the initially set discharge termination voltage may be set for each battery cell 11 and stored in the storing unit 105 in advance.

That is, the battery management apparatus 100 according to an embodiment of the present disclosure may change the control condition preset for the battery cell 11 according to the first degradation acceleration degree of the battery cell 11. For example, the battery cells 11 produced through the same production facility may have somewhat different states or specifications such as different available capacities due to various reasons. Thus, in a device equipped with a plurality of battery cells 11 such as an electric vehicle, if the control conditions of the battery cells 11 are collectively changed according to the cycle or the usage period of the battery cells 11, optimum control conditions may not be set for every battery cell 11. Therefore, the battery management apparatus 100 according to an embodiment of the present disclosure may maintain the control condition of each of the battery cells 11 optimally by changing the control condition preset for each of the battery cells 11 according to the voltage increase and decrease pattern of each of the battery cells 11. In addition, the battery management apparatus 100 according to an embodiment of the present disclosure has the advantage of maintaining the life of the battery cells 11 longer and preventing fatal problems such as overdischarge.

Preferably, the preset voltage conversion criterion may include a first voltage conversion criterion that converts the calculated voltage comparison value into a value corresponding to the C-rate and a second voltage conversion criterion that converts the calculated voltage comparison value into a value corresponding to the discharge termination voltage. In addition, the first voltage conversion criterion and the second voltage conversion criterion may be stored in the storing unit 105.

For example, the first voltage conversion criterion is a criterion for converting the voltage comparison value into a value corresponding to the C-rate, and may convert the voltage comparison value of 5 mV into 1% that is a value corresponding to the C-rate. That is, if the voltage comparison value obtained by comparing the reference OCV of the battery cell 11 with the OCV at the present cycle is 5 mV, the control unit 103 may calculate 1% as a value corresponding to the C-rate according to the first voltage conversion criterion.

As another example, the second voltage conversion criterion is a criterion for converting the voltage comparison value into a value corresponding to the discharge termination voltage, and may convert the voltage comparison value of 1 mV into 1 mV that is a value corresponding to the discharge termination voltage. That is, if the voltage comparison value obtained by comparing the reference OCV of the battery cell 11 with the OCV at the present cycle is 1 mV, the control unit 103 may calculate 1 mV as a value corresponding to the discharge termination voltage according to the second voltage conversion criterion.

Specifically, the control unit 103 may obtain the first voltage conversion value obtained by converting the calculated voltage comparison value according to the first voltage conversion criterion. In addition, the control unit 103 may be configured to change the C-rate according to the obtained first voltage conversion value.

For example, as in the former example, if 1% is calculated as a value corresponding to the C-rate according to the first voltage conversion criterion, the control unit 103 may reduce the C-rate of the battery cell 11 by 1% that is the calculated conversion value.

In addition, the control unit 103 may obtain the second voltage conversion value obtained by converting the calculated voltage comparison value according to the second voltage conversion criterion. Also, the control unit 103 may be configured to change the discharge termination voltage according to the obtained second voltage conversion value.

For example, if 1 mV is calculated as a value corresponding to the discharge termination voltage according to the second voltage conversion criterion, the control unit 103 may increase the discharge termination voltage of the battery cell 11 by 1 mV that is the conversion value.

The battery management apparatus 100 according to an embodiment of the present disclosure may change at least one of the C-rate and the discharge termination voltage, which are the control conditions preset for the battery cell 11, based on the voltage comparison value obtained by comparing the reference OCV of the battery cell 11 with the present OCV. That is, since the reference OCV of the battery cell 11 is set based on the past voltage fluctuation rate of the battery cell 11, the battery management apparatus 100 according to an embodiment of the present disclosure may change the control condition preset for the battery cell 11 at the present based on the present and past voltage fluctuation rates of the battery cell 11. Therefore, since the control condition most optimal for the present state of the battery cell 11 is set, the battery cell 11 may be degraded slowly, and the battery cell 11 may be used longer.

The control unit 103 may be configured to change the preset voltage conversion criterion only when the determined first degradation acceleration degree is accelerated degradation and at least one of the C-rate and the discharge termination voltage is changed. That is, when the first degradation acceleration degree is any one of accelerated degradation and linear degradation, the control unit 103 may change at least one of the C-rate and the discharge termination voltage, which are the control conditions preset for the battery cell 11. In addition, the control unit 103 may be configured to change the preset voltage conversion criterion only when the first degradation acceleration degree is determined as accelerated degradation.

For example, it is assumed that the first degradation acceleration degree of the battery cell 11 is accelerated degradation and the first voltage conversion criterion is a criterion for converting the voltage comparison value of 5 mV into 1%, which is the first voltage conversion value corresponding to the C-rate. The control unit 103 may change the C-rate of the battery cell 11 according to the first voltage conversion criterion. In addition, since the first degradation acceleration degree of the battery cell 11 is determined as accelerated degradation, the control unit 103 may change the first voltage conversion criterion. That is, the first voltage conversion criterion may be changed from a criterion for converting the voltage comparison value of 5 mV into the first voltage conversion value of 1% to a criterion for converting the voltage comparison value of 4.5 mV into the first voltage conversion value of 1%.

For example, it is assumed that the first degradation acceleration degree of the battery cell 11 at the first time point is accelerated degradation, the difference between the reference OCV and the OCV is 5 mV, and the initial C-rate of the battery cell 11 is 100%. In addition, as in the former example, it is assumed that the first voltage conversion criterion is a criterion for converting the voltage comparison value of 5 mV into 1%, which is the first voltage conversion value corresponding to the C-rate. The control unit 103 may reduce the C-rate set in the battery cell 11 by 1% from 100% to 99% according to the first voltage conversion criterion. In addition, the control unit 103 may change the first voltage conversion criterion to convert the voltage comparison value of 4.5 mV into 1%, which is the first voltage conversion value corresponding to the C-rate. After that, if the first degradation acceleration degree of the battery cell 11 at the second time point successive to the first time point is determined judged as accelerated degradation and the difference between the reference OCV and the OCV of the battery cell 11 is 4.5 mV, the control unit 103 may further reduce the C-rate set in the battery cell 11 by 1% from 99% to 98% according to the changed first voltage conversion criterion.

As another example, it is assumed that the first degradation acceleration degree of the battery cell 11 is determined as accelerated degradation and the second voltage conversion criterion is a criterion for converting the voltage comparison value of 1 mV into 1 mV, which is the second voltage conversion value corresponding to the discharge termination voltage. The control unit 103 may change the discharge termination voltage of the battery cell 11 according to the second voltage conversion criterion. In addition, since the first degradation acceleration degree of the battery cell 11 is determined as accelerated degradation, the control unit 103 may change the second voltage conversion criterion. That is, the second voltage conversion criterion may be changed from a criterion for converting the voltage comparison value of 1 mV into the second voltage conversion value of 1 mV to a criterion for converting the voltage comparison value of 0.9 mV into the second voltage conversion value of 1 mV.

For example, it is assumed that the first degradation acceleration degree of the battery cell 11 at the first time point is accelerated degradation, the difference between the reference OCV and the OCV is 1 mV, and the initial discharge termination voltage of the battery cell 11 is preset as 2.8 V. In addition, as in the former example, it is assumed that the second voltage conversion criterion is a criterion for converting the voltage comparison value of 1 mV into 1 mV, which is the second voltage conversion value corresponding to the discharge termination voltage. The control unit 103 may increase the discharge termination voltage set in the battery cell 11 by 1 mV from 2.8 V to 2.801 V according to the second voltage conversion criterion. In addition, the control unit 103 may change the second voltage conversion criterion to convert the voltage comparison value of 0.9 mV into the second voltage conversion value of 1 mV corresponding to the discharge termination voltage. After that, if the first degradation acceleration degree of the battery cell 11 at the second time point successive to the first time point is still determined as accelerated degradation and the difference between the reference OCV and the OCV of the battery cell 11 is 0.9 mV, the control unit 103 may further increase the discharge termination voltage set in the battery cell 11 by 1 mV from 2.801 V to 2.802 V according to the changed second voltage conversion criterion.

That is, the battery management apparatus 100 according to an embodiment of the present disclosure does not change the preset voltage conversion criterion when the first degradation acceleration degree of the battery cell 11 is linear degradation. However, if the first degradation acceleration degree of the battery cell 11 is accelerated degradation, the battery management apparatus 100 may change the control condition preset for the battery cell 11 and the preset voltage conversion criterion. That is, if the first degradation acceleration degree of the battery cell 11 is accelerated degradation, since the battery cell 11 is degraded rapidly, the battery management apparatus 100 according to an embodiment of the present disclosure may lower the rate of voltage change of the battery cell 11 and prevent rapid deterioration of the battery cell 11 by adjusting the preset voltage conversion criterion whenever the preset control condition is changed.

The control unit 103 may be configured to restore the preset voltage conversion criterion into the voltage conversion criterion before the change, only when the first degradation acceleration degree is determined as linear degradation after the preset voltage conversion criterion is changed.

For example, the control unit 103 may determine the first degradation acceleration degree of the battery cell 11 as accelerated degradation at the first time point, change the control condition preset for the battery cell 11 according to the first voltage conversion criterion, and change the first voltage conversion criterion. After that, at a time point after the first time point, if the degradation acceleration degree of the battery cell 11 is determined as linear degradation or decelerated degradation, the control unit 103 may change the changed first voltage conversion criterion to the voltage conversion criterion set initially at the first time point. That is, after the preset first voltage conversion criterion of the battery cell 11 is changed, if the degradation acceleration degree of the battery cell 11 is determined as linear degradation or decelerated degradation, since the battery cell 11 is not rapidly degraded, the changed first voltage conversion criterion may be initialized into the original first voltage conversion criterion. Similarly, after the second voltage conversion criterion is changed, if the second degradation acceleration degree of the battery cell 11 is determined as linear degradation or decelerated degradation, the control unit 103 may initialize the changed second voltage conversion criterion into the initially set second voltage conversion criterion.

That is, the battery management apparatus 100 according to an embodiment of the present disclosure may change the voltage conversion criterion preset for the battery cell 11 appropriately, if the degradation acceleration degree of the battery cell 11 is accelerated degradation and the battery cell 11 is degraded rapidly. Therefore, since the control condition of the battery cell 11 may be set most optimal for the present state of the battery cell 11 and the risk of overdischarge or sudden drop of the battery cell 11 is reduced, the battery cell 11 may be safer and useable for a long time.

The control unit 103 may determine the second degradation acceleration degree of the battery cell 11 not only based on the voltage fluctuation rate of the battery cell 11 but also based on an electric resistance fluctuation rate thereof.

The control unit 103 may calculate the present resistance of the battery cell 11 based on the received OCV. Specifically, the control unit 103 may calculate the resistance of the battery cell 11 from the OCV of the battery cell 11 received from the voltage measuring unit 101. For example, the control unit 103 may calculate the present resistance of the battery cell 11 according to the calculation formula of "$(|CCV_{EoD}-OCV_{EoD}|)\div i_{t1}$". Here, $CCV_{EoD}$ may refer to a charge or discharge voltage of the battery cell 11 measured after a time point t1 from the time point where the $OCV_{EoD}$ of the battery cell 11 is measured, $OCV_{EoD}$ may refer to the OCV of the battery cell 11 measured when the voltage of the battery cell 11 reaches the reference discharge voltage in a discharge situation, and it 1 may refer to an amount of charge or discharge current that has flowed for the time t1.

The control unit 103 may calculate the electric resistance fluctuation rate by comparing the present resistance calculated by the voltage measuring unit 101 with the pre-stored reference resistance. Here, the pre-stored reference resistance is a reference value to be compared with the present resistance of the battery cell 11 calculated by the control unit 103, and may be a value stored in the storing unit 105 in advance. For example, the pre-stored reference resistance may be a resistance of the battery cell 11 measured at a predetermined cycle. The control unit 103 may calculate the electric resistance fluctuation rate as a ratio or a difference of the resistance of the present battery cell 11 to the pre-stored reference resistance.

For example, for the first battery cell C1 shown in FIG. 1, it is assumed that the pre-stored reference resistance is A2 [Ω]. Also, it is assumed that the present resistance of the first battery cell C1 calculated by the control unit 103 is B2 [Ω] based on the OCV of the first battery cell C1 measured by the voltage measuring unit 101 at the first time point. The control unit 103 may calculate the electric resistance fluctuation rate of the first battery cell C1 at the first time point as the ratio of B2 [Ω] to A2 [Ω]. For example, the electric resistance fluctuation rate of the first battery cell C1 at the first time point may be calculated using the calculation formula of "(B2÷A2)×100".

The control unit 103 may determine the resistance increase and decrease pattern based on the calculated electric resistance fluctuation rate and the pre-stored electric resistance fluctuation rate data. Here, the pre-stored electric resistance fluctuation rate data is reference data for comparison with the calculated electric resistance fluctuation rate, and may be stored in the storing unit 105 in advance. The control unit 103 may update the pre-stored electric resistance fluctuation rate data by adding the calculated electric resistance fluctuation rate to the pre-stored electric resistance fluctuation rate data. In addition, the control unit 103 may determine the resistance increase and decrease pattern based on the updated electric resistance fluctuation rate data.

For example, the pre-stored electric resistance fluctuation rate data may be data in which electric resistance fluctuation rates calculated in the past by the control unit 103 are stored. In this case, the control unit 103 may determine the resistance increase and decrease pattern of the battery cell 11 based on all electric resistance fluctuation rates calculated from the predetermined cycle at which the reference resistance is calculated. The resistance increase and decrease pattern may include various patterns such as a resistance increase pattern, a resistance decrease pattern and a resistance constant pattern. Hereinafter, for convenience of description, it will be assumed that the resistance increase and decrease pattern includes a resistance increase pattern and a resistance decrease pattern, and the resistance increase pattern includes patterns such as a constant resistance pattern excluding the resistance decrease pattern.

The control unit 103 may determine a second degradation acceleration degree of the battery cell 11 according to the determined voltage increase and decrease pattern and the determined resistance increase and decrease pattern. Here, the second degradation acceleration degree may be information indicating whether the degradation of the battery cell 11 is getting faster or slower, similar to the first degradation acceleration degree. That is, the control unit 103 may determine the voltage increase and decrease pattern and the resistance increase and decrease pattern for the battery cell 11, and determine the second degradation acceleration degree of the battery cell 11 based on the determined voltage increase and decrease pattern and the determined resistance increase and decrease pattern.

For example, in the embodiment shown in FIG. 1, the control unit 103 may determine the voltage increase and decrease pattern and the resistance increase and decrease pattern of the first battery cell C1, and determine the second degradation acceleration degree of the first battery cell C1 according to the determined voltage increase and decrease pattern and the determined resistance increase and decrease pattern. Similarly, control unit 103 may also determine the voltage increase and decrease pattern and the resistance increase and decrease pattern for the second battery cell C2, the third battery cell C3 and the fourth battery cell C4, and determine the second degradation acceleration degree according to the determined voltage increase and decrease pattern and the determined resistance increase and decrease pattern.

The control unit 103 may be configured to change the preset control condition based on the calculated electric resistance fluctuation rate and the determined second degradation acceleration degree. That is, if both the voltage increase and decrease pattern and the resistance increase pattern of the battery cell 11 are determined, the control unit 103 may determine the second degradation acceleration degree of the battery cell 11. In addition, the control unit 103 may change the control condition preset for the battery cell 11 according to the determined second degradation acceleration degree of the battery cell 11 and the calculated electric resistance fluctuation rate of the battery cell 11.

For example, in the embodiment shown in FIG. 1, the control unit 103 may determine the voltage increase and decrease pattern, the resistance increase and decrease pattern and the second degradation acceleration degree of the first battery cell C1, and change the control condition preset for the first battery cell C1 according to the calculated electric resistance fluctuation rate of the first battery cell C1 at the present cycle. In addition, the control unit 103 may determine the voltage increase and decrease pattern, the resistance increase and decrease pattern and the second degradation acceleration degree of the second battery cell C2, and change the control condition preset for the second battery cell C2 according to the calculated electric resistance fluctuation rate of the second battery cell C2. Similarly, for the third battery cell C3 and the fourth battery cell C4, the control unit 103 may change the control condition preset for each of the third battery cell C3 and the fourth battery cell C4, based on the determined second degradation acceleration degree and the calculated electric resistance fluctuation rate.

The battery management apparatus 100 according to an embodiment of the present disclosure may change the control condition preset for the battery cell 11 based on the second degradation acceleration degree of the battery cell 11 and the electric resistance fluctuation rate at the present cycle. Therefore, since the battery management apparatus 100 according to an embodiment of the present disclosure accurately measures the present state of the battery cell 11, it is possible to take action to change the control condition of the battery cell 11 so that the life of the battery cell 11 lasts longer.

Like the first degradation acceleration degree, the control unit 103 may determine the second degradation acceleration degree as nay one of accelerated degradation, linear degradation and decelerated degradation.

In particular, the control unit 103 may independently determine the second degradation acceleration degree for each battery cell 11. For example, in the embodiment of FIG. 1, the control unit 103 may determine the voltage increase and decrease pattern and the resistance increase and decrease pattern separately for each of the first battery cell C1, the second battery cell C2, the third battery cell C3 and the fourth battery cell C4. In addition, the control unit 103 may determine the second degradation acceleration degree separately for each of the first battery cell C1, the second battery cell C2, the third battery cell C3 and the fourth battery cell C4 according to the determined voltage increase and decrease pattern and the determined resistance increase and decrease pattern. In addition, the control unit 103 may change the control condition preset for each of the first battery cell C1, the second battery cell C2, the third battery cell C3 and the fourth battery cell C4 according to the determined second degradation acceleration degree to be suitable for the present state of each battery cell.

Preferably, the pre-stored reference resistance may include a reference resistance calculated based on the reference voltage pre-stored in the storing unit 105. That is, the pre-stored reference resistance corresponds to the pre-stored reference voltage, and may be a resistance calculated based on the OCV when the battery cell 11 is discharged at a predetermined cycle so that the voltage of the battery cell 11 reaches the reference discharge voltage. The pre-stored reference resistance may be stored in the storing unit 105.

For example, in the storing unit 105, a reference voltage A1 [V] may be pre-stored, and a reference resistance A2 [Ω] calculated based on the reference voltage A1 may be pre-stored.

Preferably, the pre-stored electric resistance fluctuation rate data may be configured to include electric resistance fluctuation rates calculated by the control unit 103 whenever OCV is measured by the voltage measuring unit 101. That is, from the predetermined cycle before the present cycle, the voltage measuring unit 101 may measure the OCV when the voltage of the battery cell 11 reaches the reference discharge voltage by discharging. In addition, the control unit 103 may calculate the present resistance based on the OCV measured by the voltage measuring unit 101, and calculate the electric resistance fluctuation rate of the battery cell 11 according to the calculated present resistance and the reference resistance pre-stored in the storing unit 105. Further, the calculated electric resistance fluctuation rate may be included in the electric resistance fluctuation rate data pre-stored in the storing unit 105.

For example, in the embodiment shown in FIG. 1, the electric resistance fluctuation rate data pre-stored for the first battery cell C1 may include electric resistance fluctuation rates of the first battery cell C1 calculated from the first time point to the N-1$^{th}$ time point. Here, N is an integer of 2 or more, and when N is 2, the pre-stored electric resistance fluctuation rate data may include only the electric resistance fluctuation rate of the first battery cell C1 calculated at the first time point. If the electric resistance fluctuation rate of the first battery cell C1 is calculated at the N$^{th}$ time point by the control unit 103, the electric resistance fluctuation rate of the first battery cell C1 calculated at the N$^{th}$ time point may be included the electric resistance fluctuation rate data pre-stored in the storing unit 105. In this case, the electric resistance fluctuation rate data pre-stored in the storing unit 105 may include first to N$^{th}$ electric resistance fluctuation rates.

The battery management apparatus 100 according to an embodiment of the present disclosure may determine the present resistance increase and decrease pattern of the battery cell 11 based on the electric resistance fluctuation rate data pre-stored in the storing unit 105 from the past time point to the present time point. That is, the battery management apparatus 100 according to an embodiment of the present disclosure may determine the present resistance increase and decrease pattern of the battery cell 11 based on the pre-stored electric resistance fluctuation rate data in which electric resistance fluctuation rates calculated in the past are accumulatively stored. In addition, since the battery management apparatus 100 determines the present second degradation acceleration degree of the battery cell 11 based on the determined resistance increase and decrease pattern and the determined voltage increase and decrease pattern, the second degradation acceleration degree or the degradation degree of the battery cell 11 may be more accurately determined, compared to the case where the degradation degree of the battery cell 11 is determined only by the electric resistance fluctuation rate at a specific time point. In addition, the control condition preset for the battery cell 11 may be changed based on the determined second degradation acceleration degree to be optimized for the present state of the battery cell 11.

In addition, since the second degradation acceleration degree of the battery cell 11 may be utilized as information for estimating a future state, the battery management apparatus 100 according to an embodiment of the present disclosure has an advantage of providing information capable of estimating a future state based on the second degradation acceleration degree as well as past and present states of the battery cell 11.

The control unit 103 may calculate a rate of resistance change between a plurality of electric resistance fluctuation rates included within a predetermined number of cycles from the present cycle of the battery cell 11 among the pre-stored electric resistance fluctuation rate data and the calculated electric resistance fluctuation rate. Here, the rate of resistance change may include an average rate of change or an instantaneous rate of change of the electric resistance fluctuation rates. In addition, the plurality of electric resistance fluctuation rates included within a predetermined number of cycles from the present cycle may include a plurality of electric resistance fluctuation rates included within a preset number of cycles from the present cycle. For example, the control unit 103 may calculate a rate of resistance change of a plurality of electric resistance fluctuation rates included within 50 cycles from the present cycle. The calculation of the rate of resistance change will be described in detail with reference to FIGS. 7 and 8.

Figure 7:
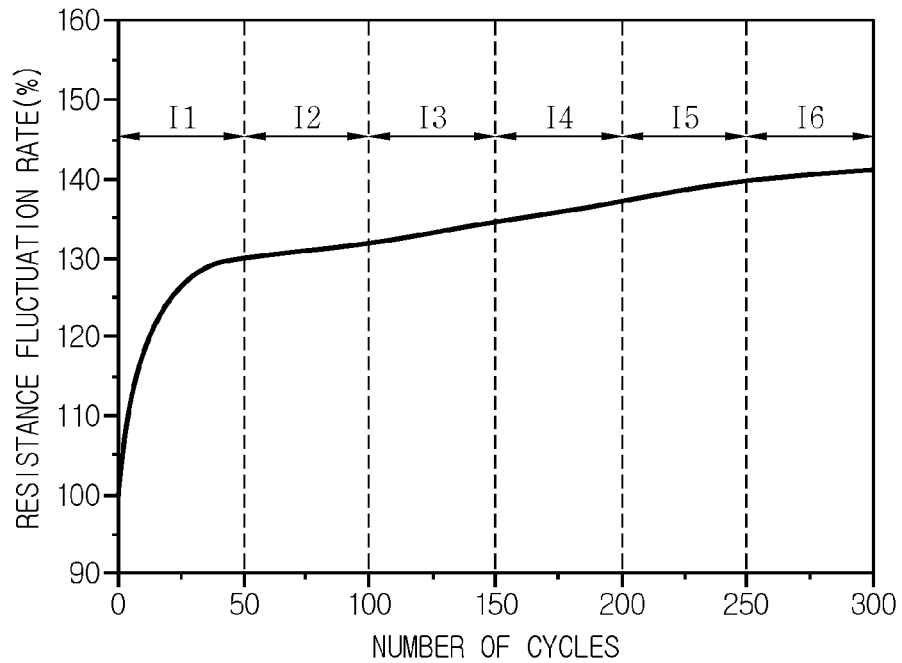
FIG. 7 is a diagram showing an electric resistance fluctuation rate of the first battery cell, calculated by the battery management apparatus according to an embodiment of the present disclosure.
Figure 8:
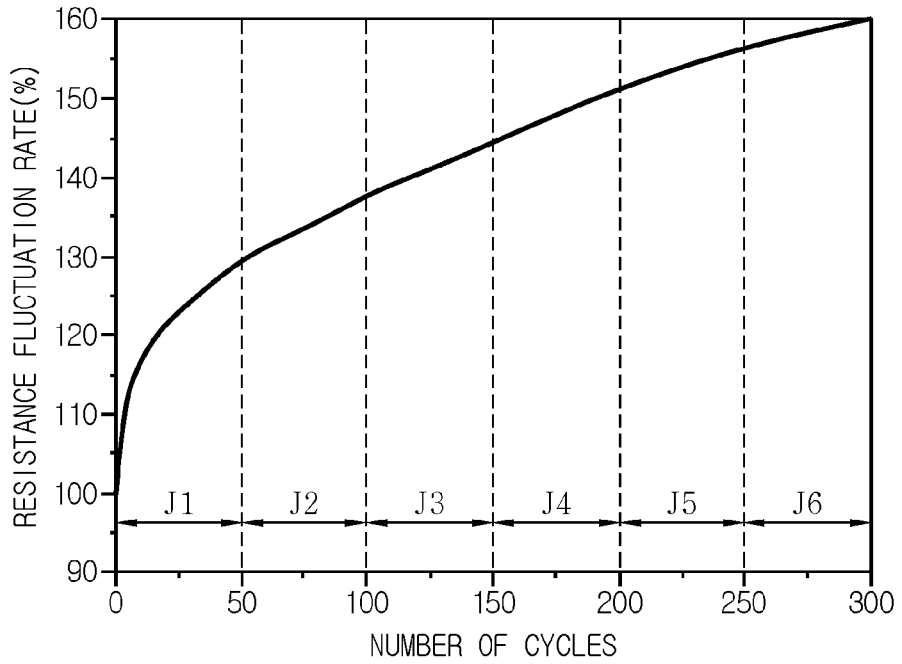
FIG. 8 is a diagram showing an electric resistance fluctuation rate of the second battery cell, calculated by the battery management apparatus according to an embodiment of the present disclosure.

FIG. 7 is a diagram showing an electric resistance fluctuation rate of the first battery cell, calculated by the battery management apparatus according to an embodiment of the present disclosure. FIG. 8 is a diagram showing an electric resistance fluctuation rate of the second battery cell, calculated by the battery management apparatus according to an embodiment of the present disclosure.

Referring to FIGS. 7 and 8, the storing unit 105 may store electric resistance fluctuation rate data pre-stored for the first battery cell C1 and electric resistance fluctuation rate data pre-stored for the second battery cell C2 at every cycle, respectively. Hereinafter, as shown in FIG. 7, a region including a preset number of cycles for the first battery cell C1 is described as an In region. Similarly, as shown in FIG. 8, a region including a preset number of cycles for the second battery cell C2 is described as a Jn region. Here, the In region shown in FIG. 7 may correspond to the In region shown in FIG. 3, and the Jn region shown in FIG. 8 may correspond to the Jn region shown in FIG. 4.

For example, it is assumed that the number of cycles preset to be included in one region is 50. In FIG. 7, if the present cycle of the first battery cell C1 is 300 cycle, the control unit 103 may extract an electric resistance fluctuation rate of each cycle belonging to the I6 region including 251 to 300 cycles of the electric resistance fluctuation rate data pre-stored in the storing unit 105 for the first battery cell C1. That is, the control unit 103 may calculate the rate of resistance change of the I6 region by comparing the electric resistance fluctuation rates of the cycles belonging to the I6 region of the first battery cell C1 with each other. Similarly, in FIG. 8, if the present cycle of the second battery cell C2 is 150 cycle, the control unit 103 may extract electric resistance fluctuation rates belonging to the J3 region including 101 to 150 cycles among the electric resistance fluctuation rate data pre-stored in the storing unit 105 for the second battery cell C2. The control unit 103 may calculate the rate of resistance change of the J3 region by comparing the electric resistance fluctuation rates of the cycles belonging to the J3 region of the second battery cell C2 with each other. Here, the rate of resistance change refers to a specific value for the rate of change.

Hereinafter, for convenience of description, it will be assumed that the rate of resistance change is a positive change rate when it is 0 or more and the rate of resistance change is a negative change rate when it is less than 0.

Similar to the example of calculating the rate of voltage change described with reference to FIG. 5, when calculating the rate of resistance change of the electric resistance fluctuation rates included in the region to which the present cycle of the battery cell 11 belongs, the control unit 103 may not calculate the rate of resistance change by determining that the present cycle belongs to only one region. In addition, the control unit 103 may determine a cycle at which the rate of resistance change changes from positive to negative or from negative to positive, and divide the region to which the present cycle of the battery cell 11 belongs into sub regions based on the determined cycle. That is, the control unit 103 may divide a single region into a plurality of sub regions according to the rate of resistance change of the electric resistance fluctuation rates belonging to the single region and calculate a rate of resistance change for each of the divided sub regions.

As described above, since the battery management apparatus 100 according to an embodiment of the present disclosure does not determine that the region to which the present cycle of the battery cell 11 belongs is only one region indiscriminately, and if necessary, the battery management apparatus 100 divides the region into sub regions and calculates a rate of resistance change in more detail, and thus there is an advantage in that the present state of the battery cell 11 may be more accurately determined.

In addition, the control unit 103 may determine a resistance increase and decrease pattern based on the calculated rate of resistance change. Here, the resistance increase and decrease pattern may include a resistance increase pattern and a resistance decrease pattern. In particular, the control unit 103 may determine the resistance increase and decrease pattern for the case where the calculated rate of change is a positive change rate as a resistance increase pattern. In addition, the control unit 103 may determine the resistance increase and decrease pattern when the calculated rate of change is a negative change rate as a resistance decrease pattern.

For example, referring to FIG. 7, if the present cycle of the first battery cell C1 belongs to the I1 region, the control unit 103 may calculate the rate of resistance change of the first battery cell C1 based on the electric resistance fluctuation rate included in the I1 region. In this case, the control unit 103 may calculate the rate of resistance change of the I1 region to a value of 0 or more. That is, the rate of resistance change of the I1 region may be calculated as a positive change rate. In addition, the control unit 103 may determine the present resistance increase and decrease pattern of the first battery cell C1 as the resistance increase pattern based on the result that the rate of resistance change is calculated as the positive change rate. Similarly, even when the present cycle of the first battery cell C1 belongs to any one of the I2 to I6 regions, the control unit 103 may calculate the rate of resistance change as a positive change rate based on the electric resistance fluctuation rate included in the region. In addition, the control unit 103 may determine the present resistance increase and decrease pattern of the first battery cell C1 as the resistance increase pattern based on the result calculated as the positive change rate.

In another example, referring to FIG. 8, if the present cycle of the second battery cell C2 belongs to the J1 region, the control unit 103 may calculate the rate of resistance change of the J1 region based on the electric resistance fluctuation rate of each cycle included in the J1 region. At this time, the control unit 103 may calculate the rate of resistance change of the J1 region as a value of 0 or more. That is, the rate of resistance change of the J1 region may be calculated as a positive change rate. In addition, the control unit 103 may determine the present resistance increase and decrease pattern of the second battery cell C2 as the resistance increase pattern based on the calculated rate of resistance change of the J1 region. Similarly, even when the present cycle of the second battery cell C2 belongs to any one of the J2 to J6 regions, the control unit 103 may calculate the rate of resistance change as a positive change rate based on the electric resistance fluctuation rate included in the region. In addition, the control unit 103 may also determine the resistance increase and decrease pattern as the resistance increase pattern for the J2 to J6 regions calculated as the positive change rate.

That is, since the battery management apparatus 100 according to an embodiment of the present disclosure determines the present resistance increase and decrease pattern of the battery cell 11 according to the calculated electric resistance fluctuation rate of the present cycle and the previous rate of resistance change stored in the pre-stored electric resistance fluctuation rate data, there is an advantage that the state of the battery cell 11 may be estimated by considering not only the present state of the battery cell 11 but also the previous state thereof. In addition, since the battery management apparatus 100 according to an embodiment of the present disclosure calculates the rate of resistance change of the battery cell 11 and determines the resistance increase and decrease pattern based on the calculated rate of resistance change, there is an advantage of providing information that allows to easily estimate a future state of the battery cell 11.

Preferably, the control unit 103 may be configured to determine the resistance increase and decrease pattern of the battery cell 11 only when the voltage increase and decrease pattern of the battery cell 11 is determined as the voltage increase pattern and the calculated electric resistance fluctuation rate is greater than the preset resistance lower limit. That is, only when the voltage increase and decrease pattern of the battery cell 11 is determined as the voltage increase pattern and the electric resistance fluctuation rate is greater than the preset resistance lower limit, the control unit 103 may determine the resistance increase and decrease pattern and determine the second degradation acceleration degree of the battery cell 11 according to the determined resistance increase and decrease pattern. For example, as described above, in a discharge situation, if the voltage increase and decrease pattern of the battery cell 11 is the voltage decrease pattern, this means that the OCV affects a change factor of resistance of the battery cell 11. In addition, if the electric resistance fluctuation rate of the battery cell 11 is smaller than or equal to the preset lower limit, this is the case where the OCV and the resistance of the battery cell 11 decrease to a reference value or below due to an electric short circuit or the like, and the battery cell 11 is abnormally degraded. Therefore, the control unit 103 may determine the resistance increase and decrease pattern only when the battery cell 11 is normally degraded, except for the case where the OCV affects the change factor of resistance of the battery cell 11 and the battery cell 11 is abnormally degraded.

If the normal or abnormal state of the battery cell 11 is not distinguished in advance, the second degradation acceleration degree may be determined according to the resistance increase and decrease pattern in an abnormal state, and the battery control condition may be adjusted according to the determined second degradation acceleration degree, which may further deteriorate the state of the battery cell 11. Accordingly, since the battery management apparatus 100 according to an embodiment of the present disclosure determines the resistance increase and decrease pattern and the second degradation acceleration degree only when the state of the battery cell 11 is a normally degraded state, it is possible to shorten the time required to determine the second degradation acceleration degree of the battery cell 11 and to improve the accuracy of determining the state of the battery cell 11.

Hereinafter, the process for the control unit 103 to determine the voltage increase and decrease pattern and the resistance increase and decrease pattern, determine the second degradation acceleration degree according to the determined voltage increase and decrease pattern and the determined resistance increase and decrease pattern and change the control condition preset for the battery cell 11 based on the determined second degradation acceleration degree will be described in more detail.

The control unit 103 may be configured to determine the second degradation acceleration degree of the battery cell 11 as any one of accelerated degradation and linear degradation according to the calculated rate of resistance change only when the voltage increase and decrease pattern is determined as the voltage increase pattern and the resistance increase and decrease pattern is determined as the resistance increase pattern. In addition, when the voltage increase and decrease pattern is determined as the voltage increase pattern and the resistance increase and decrease pattern is determined as the resistance decrease pattern, the control unit 103 may be configured to determine the second degradation acceleration degree of the battery cell 11 as the decelerated degradation. Specifically, in a discharge situation, the OCV may affect a change factor of resistance. For example, in the case of the voltage decrease pattern, or in the case of the voltage increase pattern and the resistance decrease pattern, it may be considered that OCV affects a change factor of resistance. Therefore, the control unit 103 may be configured to determine the second degradation acceleration degree of the battery cell 11 according to the resistance increase and decrease pattern and the rate of resistance change only when OCV does not affect the change factor of resistance.

For example, in the embodiments of FIGS. 3 and 7, as in the former example, the control unit 103 may determine the voltage increase and decrease pattern of the first battery cell C1 as a voltage decrease pattern for the I1 region and as a voltage increase pattern for the I2 to I6 regions. In addition, the control unit 103 may determine the resistance increase and decrease pattern of the first battery cell C1 as the resistance increase pattern for all of the I1 to I6 regions. At this time, the control unit 103 may determine the second degradation acceleration degree of the first battery cell C1 based on the calculated rate of resistance change of each region only for the I2 to I6 regions in which the voltage increase and decrease pattern is determined as a voltage increase pattern and the resistance increase and decrease pattern is determined as a resistance increase pattern. That is, the control unit 103 may select a region in which the second degradation acceleration degree of the battery cell 11 may be determined only by the resistance increase and decrease pattern in consideration of the voltage increase and decrease pattern and the resistance increase and decrease pattern, and determine the second degradation acceleration degree of the battery cell 11 only for the selected region according to the rate of resistance change. In the above example, the control unit 103 may select the I2 to I6 regions as a region in which the second degradation acceleration degree of the first battery cell C1 may be determined only by the resistance increase and decrease pattern, and determine the second degradation acceleration degree of the first battery cell C1 for each region as any one of accelerated degradation and linear degradation according to the rate of resistance change of each of the selected I2 to I6 regions.

In another example, referring to FIGS. 4, 5 and 8, as in the former example, the control unit 103 may determine the voltage increase and decrease pattern of the second battery cell C2 as the voltage increase pattern for the J1 to J31 regions and as the voltage decrease pattern for the J32 to J6 regions. In addition, the control unit 103 may determine the resistance increase and decrease pattern of the second battery cell C2 as the resistance increase pattern for all of the J1 to J6 regions. At this time, in the control unit 103 may determine the second degradation acceleration degree of the second battery cell C2 based on the calculated rate of resistance change of each region, only for the J1 to J31 regions in which the voltage increase and decrease pattern is determined as the voltage increase pattern and the resistance increase and decrease pattern is determined as the resistance increase pattern. That is, the control unit 103 may select the J1 to J31 as regions in which the second degradation acceleration degree of the second battery cell C2 may be determined only using the resistance increase and decrease pattern, and determine the second degradation acceleration degree of the second battery cell C2 for each region as any one of accelerated degradation and linear degradation based on the rate of resistance change of each of the selected J1 to J31 regions.

That is, in a discharge state of the battery cell 11, unlike the charge situation, the state of the battery cell 11 may be accurately diagnosed when a change factor of the resistance caused by OCV is put into consideration. Therefore, since the battery management apparatus 100 according to an embodiment of the present disclosure determines the second degradation acceleration degree of the battery cell 11 based on the electric resistance fluctuation rate in consideration of the change factor of the resistance in the discharge situation, the state for the second degradation acceleration degree, the degradation degree, or the like of the battery cell 11 in the discharge situation may be more accurately determined.

As described above, among the second degradation acceleration degrees of the battery cell 11, the accelerated degradation and the linear degradation may be distinguished according to how fast the battery cell 11 is degraded. The control unit 103 may be configured to determine the second degradation acceleration degree of the battery cell 11 as the accelerated degradation, if the voltage increase and decrease pattern is the voltage increase pattern, the resistance increase and decrease pattern is the resistance increase pattern, and the calculated rate of resistance change is equal to or greater than a preset reference rate of resistance change. In addition, the control unit 103 may be configured to determine the second degradation acceleration degree of the battery cell 11 as the linear degradation, if the voltage increase and decrease pattern is the voltage increase pattern, the resistance increase and decrease pattern is the resistance increase pattern, and the calculated rate of resistance change is smaller than the preset reference rate of resistance change. Conversely, if the voltage increase and decrease pattern is the voltage decrease pattern, or if the voltage increase and decrease pattern is the voltage increase pattern and the resistance increase and decrease pattern is the resistance decrease pattern, the control unit 103 may determine the second degradation acceleration degree of the battery cell 11 based on the voltage increase and decrease pattern without considering the resistance increase and decrease pattern.

Here, the preset reference rate of resistance change is a reference rate of change for determining the second degradation acceleration degree as any one of accelerated degradation and linear degradation, when the resistance increase and decrease pattern of the battery cell 11 is determined as the resistance increase pattern. For example, the preset reference rate of resistance change may be preset such that the electric resistance fluctuation rate increases by 10% at every 100 cycles. In addition, the preset reference rate of resistance change may be stored in the storing unit 105 in advance.

For example, in the embodiment of FIGS. 3 and 7, if the present cycle of the first battery cell C1 belongs to any one of the I2 to I6 regions, the control unit 103 may compare the rate of resistance change of the region to which the present cycle of the first battery cell C1 belongs with the preset reference rate of resistance change. That is, since the I2 to I6 regions are regions where the voltage increase and decrease pattern is the voltage increase pattern and the resistance increase and decrease pattern is the resistance increase pattern, the control unit 103 may compare the rate of resistance change of the region to which the present cycle of the first battery cell C1 belongs with the preset reference rate of resistance change. For example, assuming that the rate of resistance change of the I2 to I6 regions is smaller than the preset reference rate of resistance change, the control unit 103 may determine the second degradation acceleration degree of the first battery cell C1 as the linear degradation.

Similarly, in the embodiment of FIGS. 4, 5 and 8, if the present cycle of the second battery cell C2 belongs to any one of the J1 to J31 regions, the control unit 103 may compare the rate of resistance change of the region to which the present cycle of the second battery cell C2 belongs with the preset reference rate of resistance change. That is, since the J1 to J31 regions are regions where the voltage increase and decrease pattern is the voltage increase pattern and the resistance increase and decrease pattern is the resistance increase pattern, the control unit 103 may compare the rate of resistance change of the region to which the present cycle of the second battery cell C2 belongs with the preset reference rate of resistance change. For example, assuming that the rate of resistance change of the J1 to J31 regions is greater than the preset reference rate of resistance change, the control unit 103 may determine the second degradation acceleration degree of the second battery cell C2 as the accelerated degradation.

For example, in the embodiment of FIGS. 3 to 8, the I1 region and the J32 to J6 regions are regions where the voltage increase and decrease pattern of the battery cell 11 is the voltage decrease pattern. Accordingly, the control unit 103 may determine the first degradation acceleration degree based on the voltage increase and decrease pattern for the I1 region and the J32 to J6 regions, without determining the second degradation acceleration degree based on the resistance increase and decrease pattern.

That is, the battery management apparatus 100 according to an embodiment of the present disclosure may compare the preset reference rate of resistance change with the rate of resistance change and determine the second degradation acceleration degree by subdividing the same into any one of accelerated degradation and linear degradation, without indiscriminately determining the second degradation acceleration degree for the resistance increase pattern. Therefore, the present state of the battery cell 11 may be further subdivided and specifically diagnosed.

The preset control condition may include at least one of a C-rate and a discharge termination voltage (Vmin) set for the battery cell 11. The preset control condition is set in advance for the battery cell 11 when the battery cell 11 is shipped or first operated, and may be changed later by the control unit 103 according to the second degradation acceleration degree of the battery cell 11. In addition, the preset control conditions may be stored in the storing unit 105. For example, in the embodiment of FIG. 1, the preset control conditions may be set for each of the first battery cell C1, the second battery cell C2, the third battery cell C3 and the fourth battery cell C4.

In addition, the control unit 103 may determine the electric resistance fluctuation rate of the battery cell 11 measured at the start cycle of the determined resistance increase and decrease pattern as a reference electric resistance fluctuation rate only when the determined voltage increase and decrease pattern is a voltage increase pattern and the determined second degradation acceleration degree is any one of accelerated degradation and linear degradation. That is, the control unit 103 may not set the reference electric resistance fluctuation rate if the determined second degradation acceleration degree is decelerated degradation.

First, the control unit 103 may determine the voltage increase and decrease pattern and the resistance increase and decrease pattern of the battery cell 11, and determine the second degradation acceleration degree according to the determined voltage increase and decrease pattern and the determined resistance increase and decrease pattern. In addition, if the second degradation acceleration degree is any one of accelerated degradation and linear degradation, the control unit 103 may select a start cycle of the determined resistance increase and decrease pattern. Here, the start cycle of the resistance increase and decrease pattern corresponds to the start cycle of the voltage increase and decrease pattern described above, and may be a starting point of a resistance increase and decrease pattern that is continued from the present resistance increase and decrease pattern of the battery cell 11 determined by the control unit 103 and identical thereto. That is, the control unit 103 may select a best region determined as a resistance increase and decrease pattern identical to the resistance increase and decrease pattern of the region to which the present cycle of the battery cell 11 belongs, among consecutive regions before the region to which the present cycle of the battery cell 11 belongs. In addition, the control unit 103 may select a start cycle of the selected best region.

For example, if the second degradation acceleration degree of the battery cell 11 after 0 cycle is any one of accelerated degradation and linear degradation and the resistance increase and decrease pattern of the battery cell 11 is entirely determined as a resistance increase pattern, the start cycle of resistance increase pattern may be 0 cycle. As another example, if the resistance increase and decrease pattern of the battery cell 11 at 0 cycle to 100 cycle is a resistance decrease pattern and the resistance increase and decrease pattern of the battery cell 11 at 101 cycle to the present cycle is determined as a resistance increase pattern, the start cycle of the resistance increase pattern may be 101 cycle. After the start cycle is selected, the control unit 103 may set the electric resistance fluctuation rate of the battery cell 11 measured at the selected start cycle as the reference electric resistance fluctuation rate.

For example, in the embodiment shown in FIG. 7, it is assumed that the present cycle of the first battery cell C1 belongs to the I6 region and the resistance increase and decrease patterns of the I1 to I6 regions are all resistance increase patterns. In addition, as in the former example, it is assumed that the voltage increase and decrease patterns of the I2 to I6 regions among the regions shown in FIG. 3 are a voltage increase pattern. The control unit 103 may select a best region in which the voltage increase and decrease pattern is a voltage increase pattern and the resistance increase and decrease pattern is a resistance increase and decrease pattern identical to the resistance increase and decrease pattern of the I6 region, among the consecutive regions before the I6 region to which the present cycle of the first battery cell C1 belongs. In this case, among regions before the I6 region, regions consecutive to the I6 region are I1 to I5 regions. In addition, the voltage increase and decrease patterns of the I2 to I5 regions are a voltage increase pattern, and the resistance increase and decrease patterns thereof are a resistance increase pattern identical to the resistance increase and decrease pattern of the I6 region, among the I1 to I5 regions. Therefore, the control unit 103 may select the I2 region as the best region. In addition, the control unit 103 may set the electric resistance fluctuation rate of the first battery cell C1 measured at the start cycle of the I2 region as the reference electric resistance fluctuation rate.

In addition, the control unit 103 may calculate a resistance comparison value obtained by comparing the set reference electric resistance fluctuation rate with the electric resistance fluctuation rate received from the voltage measuring unit 101. For example, if the set reference electric resistance fluctuation rate is 100% and the electric resistance fluctuation rate received from the voltage measuring unit 101 is 110%, the control unit 103 may calculate 10% as the resistance comparison value.

For example, as in the former example, in the embodiment shown in FIG. 7, the control unit 103 may compare the electric resistance fluctuation rate of the first battery cell C1 measured at the start cycle of the I2 region, namely the reference electric resistance fluctuation rate, with the electric resistance fluctuation rate measured at the present cycle of the first battery cell C1. The control unit 103 may calculate a difference between the reference electric resistance fluctuation rate and the electric resistance fluctuation rate measured at the present cycle of the first battery cell C1 as a resistance comparison value. In the example of FIG. 7, if the reference electric resistance fluctuation rate is 130% and the electric resistance fluctuation rate measured at the present cycle of the first battery cell C1 is 142%, the control unit 103 may calculate 12% as the resistance comparison value.

In addition, the control unit 103 may be configured to change at least one of a C-rate and a discharge termination voltage based on the resistance conversion value obtained by converting the calculated resistance comparison value according to a preset resistance conversion criterion. Here, the preset resistance conversion criterion may be stored in the storing unit 105. That is, the control unit 103 may change the control condition preset for the battery cell 11 by converting the calculated resistance comparison value into a conversion value corresponding to the C-rate or the discharge termination voltage and changing the C-rate or the discharge termination voltage according to the conversion value.

For example, the control unit 103 may calculate a resistance comparison value that is a difference between the reference electric resistance fluctuation rate of the battery cell 11 and the present electric resistance fluctuation rate, calculate a resistance conversion value obtained by converting the calculated resistance comparison value according to the preset conversion criterion, and reduce the C-rate of the battery cell 11 according to the calculated conversion value. For example, the control unit 103 may reduce the C-rate of the battery cell 11 by 1% from the initially set C-rate whenever the present electric resistance fluctuation rate of the battery cell 11 increases by 5% from the reference electric resistance fluctuation rate. Here, the initially set C-rate may be set for each battery cell 11 and stored in the storing unit 105 in advance.

As another example, the control unit 103 may also calculate a difference in resistance between the reference electric resistance fluctuation rate of the battery cell 11 and the present electric resistance fluctuation rate, and raise the discharge termination voltage of the battery cell 11 based on the calculated resistance difference. For example, the control unit 103 may increase the discharge termination voltage of the battery cell 11 by 10 mV from the initially set discharge termination voltage whenever the present electric resistance fluctuation rate of the battery cell 11 increases by 5% from the reference electric resistance fluctuation rate. Here, the initially set discharge termination voltage may be set for each battery cell 11 and stored in the storing unit 105 in advance.

The battery management apparatus 100 according to an embodiment of the present disclosure has an advantage of maintaining the control condition in an optimal condition by changing the control condition preset for each battery cell 11 according to the voltage increase and decrease pattern and the resistance increase and decrease pattern of each battery cell 11. In addition, the battery management apparatus 100 according to an embodiment of the present disclosure has an advantage of extending the lifespan of the battery cell 11 and preventing fatal problems such as overdischarge and sudden drop.

Preferably, the preset resistance conversion criterion may include a first resistance conversion criterion that converts the calculated resistance comparison value into a value corresponding to the C-rate and a second resistance conversion criterion that converts the calculated resistance comparison value into a value corresponding to the discharge termination voltage. In addition, the first resistance conversion criterion and the second resistance conversion criterion may be stored in the storing unit 105.

For example, the first resistance conversion criterion is a criterion for converting the resistance comparison value into a value corresponding to the C-rate, and may convert the resistance comparison value of 5% into a value of 1% corresponding to the C-rate. That is, if the resistance comparison value obtained by comparing the reference electric resistance fluctuation rate of the battery cell 11 with the electric resistance fluctuation rate of the present cycle is 5%, the control unit 103 may calculate 1% as a value corresponding to the C-rate according to the first resistance conversion criterion.

As another example, the second resistance conversion criterion is a criterion for converting the resistance comparison value into a value corresponding to the discharge termination voltage, and may convert the resistance comparison value of 5% into a value of 10 mV corresponding to the discharge termination voltage. That is, if the resistance comparison value obtained by comparing the reference electric resistance fluctuation rate of the battery cell 11 with the electric resistance fluctuation rate of the present cycle is 5%, the control unit 103 may calculate 10 mV as a value corresponding to the discharge termination voltage according to the second resistance conversion criterion.

Specifically, the control unit 103 may obtain the first resistance conversion value by converting the calculated resistance comparison value according to the first resistance conversion criterion. In addition, the control unit 103 may be configured to change the C-rate according to the obtained first resistance conversion value.

For example, if 1% is calculated as a value corresponding to the C-rate according to the first resistance conversion criterion in the previous example, the control unit 103 may reduce the C-rate of the battery cell 11 by 1%, which is the calculated conversion value.

In addition, the control unit 103 may obtain the second resistance conversion criterion by converting the calculated resistance comparison value according to the second resistance conversion criterion. Also, the control unit 103 may be configured to change the discharge termination voltage according to the obtained second resistance conversion value.

For example, if 10 mV is calculated as a value corresponding to the discharge termination voltage according to the second resistance conversion criterion, the control unit 103 may increase the discharge termination voltage of the battery cell 11 by 10 mV, which is the calculated conversion value.

The battery management apparatus 100 according to an embodiment of the present disclosure may change at least one of the C-rate and the discharge termination voltage, which are the control conditions preset for the battery cell 11, based on the resistance comparison value obtained by comparing the reference electric resistance fluctuation rate of the battery cell 11 with the present electric resistance fluctuation rate. That is, since the reference electric resistance fluctuation rate of the battery cell 11 is set based on the past electric resistance fluctuation rate of the battery cell 11, the battery management apparatus 100 according to an embodiment of the present disclosure may change the control condition preset for the battery cell 11 at the present based on the present and past electric resistance fluctuation rate of the battery cell 11. Therefore, since the control condition most optimal for the present state of the battery cell 11 is set, the battery cell 11 is degraded slowly, and thus the battery cell 11 may be used longer.

The control unit 103 may be configured to change the preset resistance conversion criterion only when the determined second degradation acceleration degree is accelerated degradation and at least one of the C-rate and the discharge termination voltage is changed. That is, the control unit 103 may change at least one of the C-rate and the discharge termination voltage, which are the control conditions preset for the battery cell 11, when the second degradation acceleration degree is any one of accelerated degradation and linear degradation. In addition, the control unit 103 may be configured to change the preset resistance conversion criterion only when the second degradation acceleration degree is determined as accelerated degradation.

For example, it is assumed that the second degradation acceleration degree of the battery cell 11 is determined as accelerated degradation and the first resistance conversion criterion is a criterion for converting the resistance comparison value 5% into 1% that is the first resistance conversion value corresponding to the C-rate. The control unit 103 may change the C-rate of the battery cell 11 according to the first resistance conversion criterion. In addition, since the second degradation acceleration degree of the battery cell 11 is determined as accelerated degradation, the control unit 103 may change the first resistance conversion criterion. That is, the first resistance conversion criterion may be changed from a criterion for converting the resistance comparison value of 5% into the first resistance conversion value of 1%, to a criterion for converting the resistance comparison value of 4.5% into the first resistance conversion value of 1%.

For example, it is assumed that the voltage increase and decrease pattern of the battery cell 11 at the first time point is a voltage increase pattern, the second degradation acceleration degree is accelerated degradation, the difference between the reference electric resistance fluctuation rate and the electric resistance fluctuation rate is 5%, and the initial C-rate of the battery cell 11 is 100%. In addition, as in the previous example, it is assumed that the first resistance conversion criterion is a criterion for converting the resistance comparison value of 5% into the first resistance conversion value of 1% corresponding to the C-rate. The control unit 103 may reduce the C-rate set in the battery cell 11 by 1% from 100% to 99% according to the first resistance conversion criterion. In addition, the control unit 103 may change the first resistance conversion criterion to convert the resistance comparison value of 4.5% into the first resistance conversion value of 1% corresponding to the C-rate. After that, if the voltage increase and decrease pattern of the battery cell 11 at the second time point subsequent to the first time point is the voltage increase pattern, the second degradation acceleration degree is still determined as accelerated degradation, and the difference between the reference electric resistance fluctuation rate of the battery cell 11 and the electric resistance fluctuation rate is 4.5%, the control unit 103 may further reduce the C-rate set in the battery cell 11 by 1% from 99% to 98% according to the changed first resistance conversion criterion.

As another example, it is assumed that the voltage increase and decrease pattern of the battery cell 11 is a voltage increase pattern, the second degradation acceleration degree is determined as accelerated degradation, and the second resistance conversion criterion is a criterion for converting the resistance comparison value of 5% into the second resistance conversion value of 10 mV corresponding to the discharge termination voltage. The control unit 103 may change the discharge termination voltage of the battery cell 11 according to the second resistance conversion criterion. In addition, since the second degradation acceleration degree of the battery cell 11 is determined as accelerated degradation, the control unit 103 may change the second resistance conversion criterion. That is, the second resistance conversion criterion may be changed from a criterion for converting the resistance comparison value of 5% into the second resistance conversion value of 10 mV to a criterion for converting the resistance comparison value of 4.5% into the second resistance conversion value of 10 mV.

For example, it is assumed that the voltage increase and decrease pattern of the battery cell 11 at the first time point is a voltage increase pattern, the second degradation acceleration degree is accelerated degradation, the difference between the reference electric resistance fluctuation rate and the electric resistance fluctuation rate is 5%, and the initial discharge termination voltage of the battery cell 11 is preset as 2.8 V. In addition, as in the previous example, it is assumed that the second resistance conversion criterion is a criterion for converting the resistance comparison value of 5% into 10 mV, which is the second resistance conversion value corresponding to the discharge termination voltage. The control unit 103 may increase the discharge termination voltage set in the battery cell 11 by 10 mV from 2.8 V to 2.81 V according to the second resistance conversion criterion. In addition, the control unit 103 may change the second resistance conversion criterion to convert the resistance comparison value of 4.5% into the second resistance conversion value of 10 mV corresponding to the discharge termination voltage. After that, if the voltage increase and decrease pattern of the battery cell 11 at the second time point subsequent to the first time point is the voltage increase pattern, the second degradation acceleration degree is still determined as accelerated degradation, and the difference between the reference electric resistance fluctuation rate and the electric resistance fluctuation rate of the battery cell 11 is 4.5%, the control unit 103 may further increase the discharge termination voltage set in the battery cell 11 by 10 mV from 2.81 V to 2.82 V according to the changed second resistance conversion criterion.

That is, the battery management apparatus 100 according to an embodiment of the present disclosure does not change the preset resistance conversion criterion when the second degradation acceleration degree of the battery cell 11 is linear degradation. However, if the second degradation acceleration degree of the battery cell 11 is accelerated degradation, the battery management apparatus 100 may change the control condition preset for the battery cell 11, and change the preset resistance conversion criterion. That is, if the voltage increase and decrease pattern of the battery cell 11 is the voltage increase pattern and the second degradation acceleration degree is accelerated degradation, since the battery cell 11 is degraded rapidly, the battery management apparatus 100 according to an embodiment of the present disclosure adjusts the preset resistance conversion criterion whenever the preset control condition is changed, thereby reducing the rate of resistance change of the battery cell 11 and preventing rapid degradation of the battery cell 11.

The control unit 103 may be configured to restore the preset resistance conversion criterion into the resistance conversion criterion before the change, only when the second degradation acceleration degree is determined as linear degradation or decelerated degradation after the preset resistance conversion criterion is changed.

For example, the control unit 103 may determine the second degradation acceleration degree of the battery cell 11 as accelerated degradation at the first time point, change the control condition preset for the battery cell 11 according to the first resistance conversion criterion, and change the first resistance conversion criterion. After that, at a time point after the first time point, if the second degradation acceleration degree of the battery cell 11 is determined as linear degradation or decelerated degradation, the control unit 103 may restore the changed first resistance conversion criterion into the first resistance conversion criterion before the change at the first time point. That is, after the preset resistance conversion criterion of the battery cell 11 is changed, if the second degradation acceleration degree of the battery cell 11 is determined as linear degradation or decelerated degradation, the changed resistance conversion criterion may be initialized to the original resistance conversion criterion. Similarly, after the second resistance conversion criterion is changed, if the second degradation acceleration degree of the battery cell 11 is determined as linear degradation or decelerated degradation, the control unit 103 may initialize the changed second resistance conversion criterion to the initially set second resistance conversion criterion.

That is, if the degradation acceleration degree of the battery cell 11 is accelerated degradation and thus the battery cell 11 is degraded rapidly, the battery management apparatus 100 according to an embodiment of the present disclosure may suitably change the preset resistance conversion criterion for the battery cell 11 according to the degradation acceleration degree of the battery cell 11. Therefore, since the control condition of the battery cell 11 may be set most optimal for the present state of the battery cell 11 and the risk of overdischarge or sudden drop of the battery cell 11 is reduced, the battery cell 11 may be safer and useable for a long time.

Figure 9:
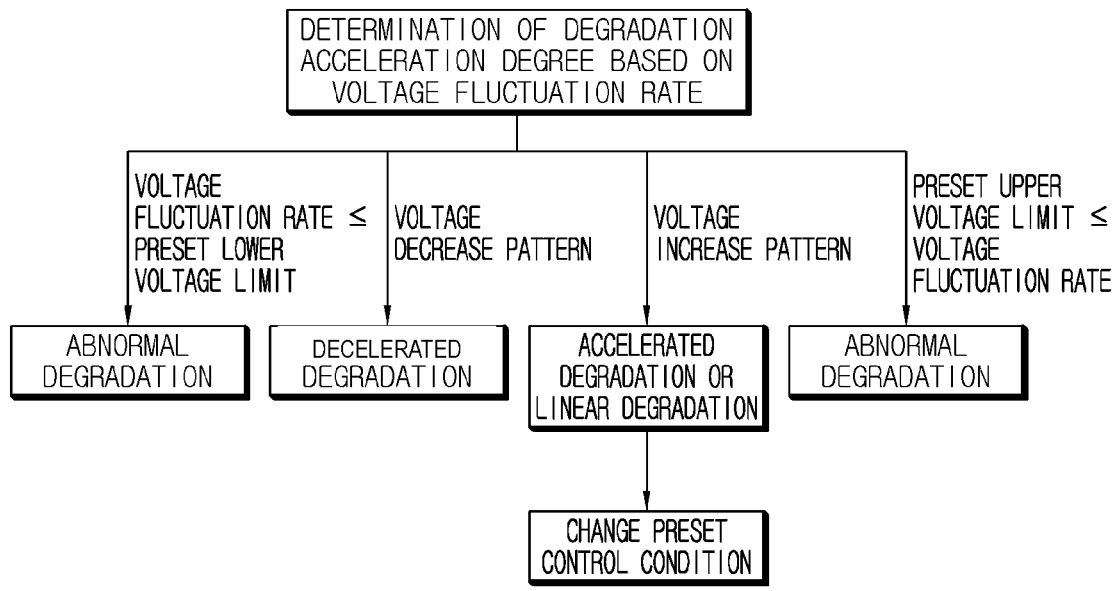
FIG. 9 is a diagram schematically showing a process of changing a control condition preset for a battery cell based on the voltage fluctuation rate by the battery management apparatus according to an embodiment of the present disclosure in a tree structure.

FIG. 9 is a diagram schematically showing a process of changing a control condition preset for a battery cell based on the voltage fluctuation rate by the battery management apparatus 100 according to an embodiment of the present disclosure in a tree structure.

Referring to FIG. 9, first, the first degradation acceleration degree of the battery cell 11 may be determined according to the voltage increase and decrease pattern of the battery cell 11 determined by the control unit 103. In addition, the control condition preset for the battery cell 11 may be changed according to the determined first degradation acceleration degree.

If the voltage fluctuation rate of the battery cell 11 calculated by the control unit 103 is equal to or smaller than the preset lower voltage limit or equal to or greater than the preset upper voltage limit, it may be determined as abnormal degradation. If the battery cell 11 is determined to be abnormally degraded, the control unit 103 may not determine the voltage increase and decrease pattern based on the voltage fluctuation rate. That is, the control unit 103 may be configured to determine the voltage increase and decrease pattern only when the voltage fluctuation rate of the battery cell 11 is included in the normal range, and to determine the first degradation acceleration degree of the battery cell 11 according to the determined voltage increase and decrease pattern.

If the voltage fluctuation rate of the battery cell 11 is greater than the preset lower voltage limit and smaller than the preset upper voltage limit, the control unit 103 may determine the voltage increase and decrease pattern of the battery cell 11 based on the calculated voltage fluctuation rate and the pre-stored voltage fluctuation rate data. In addition, if the determined voltage increase and decrease pattern is the voltage decrease pattern, the control unit 103 may determine the first degradation acceleration degree of the battery cell 11 as the decelerated degradation, and if the determined voltage increase and decrease pattern is the voltage increase pattern, the control unit 103 may determine the first degradation acceleration degree of the battery cell 11 as any one of accelerated degradation and linear degradation. That is, if the determined voltage increase and decrease pattern is the voltage decrease pattern, the control unit 103 may determine the first degradation acceleration degree of the battery cell 11 only as the decelerated degradation. Conversely, if the determined voltage increase and decrease pattern is the voltage increase pattern, the control unit 103 may compare the rate of voltage change of the battery cell 11 with the preset reference rate of voltage change to classify the first degradation acceleration degree of the battery cell 11 in more detail into any one of accelerated degradation and linear degradation.

In addition, the control unit 103 may change the control condition preset for the battery cell 11 only when the first degradation acceleration degree of the battery cell 11 is determined as any one of accelerated degradation and linear degradation.

Figure 10:
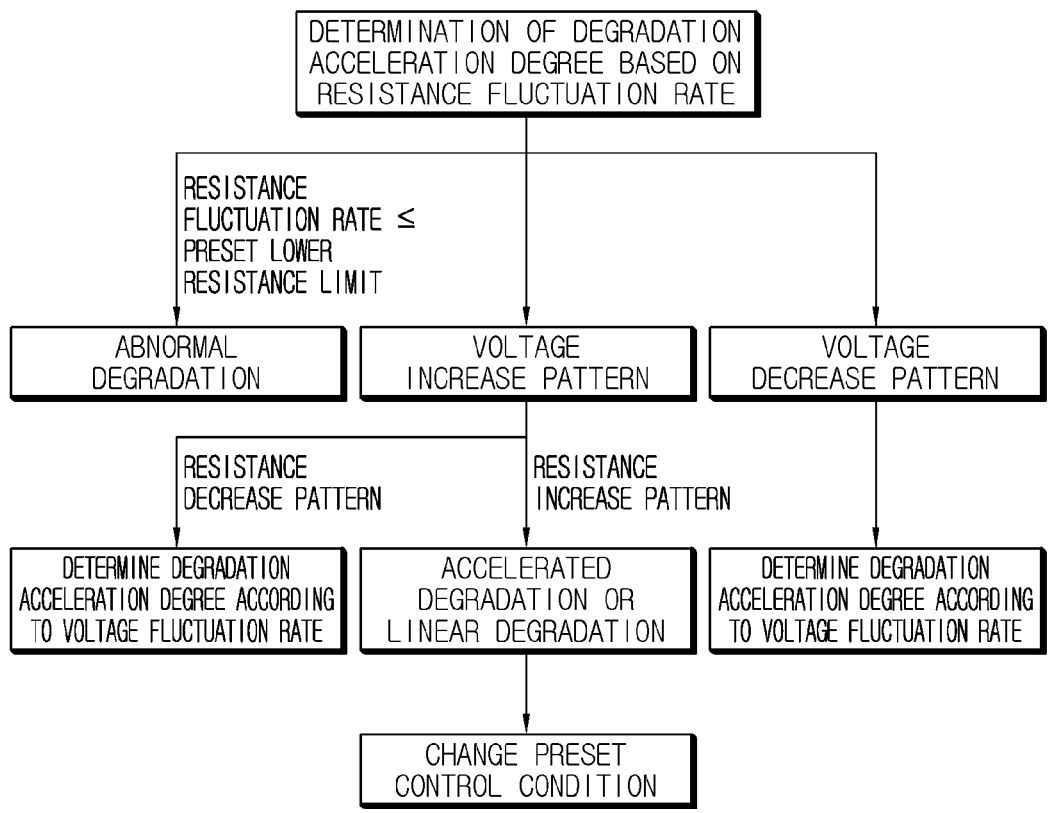
FIG. 10 is a diagram schematically showing a process of changing a control condition preset for a battery cell based on the electric resistance fluctuation rate by the battery management apparatus according to an embodiment of the present disclosure in a tree structure.

FIG. 10 is a diagram schematically showing a process of changing a control condition preset for a battery cell based on the electric resistance fluctuation rate by the battery management apparatus 100 according to an embodiment of the present disclosure in a tree structure.

Referring to FIG. 10, first, the control unit 103 may determine the second degradation acceleration degree of the battery cell 11 according to the determined voltage increase and decrease pattern and the determined resistance increase and decrease pattern of the battery cell 11. In addition, the control conditions preset for the battery cell 11 may be changed according to the determined degradation acceleration degree. In addition, the process of determining the second degradation acceleration degree may be classified according to the voltage increase and decrease pattern of the battery cell 11 determined by the control unit 103, when being performed based on the electric resistance fluctuation rate.

If the electric resistance fluctuation rate of the battery cell 11 calculated by the control unit 103 is equal to or smaller than the preset lower resistance limit, the control unit 103 may determine the degradation state of the battery cell 11 as abnormal degradation. The control unit 103 may not determine the degradation acceleration degree of the battery cell 11 if the degradation state of the battery cell 11 is abnormal degradation, and the control unit 103 may determine the second degradation acceleration degree of the battery cell 11 only when the degradation state of the battery cell 11 is normal degradation.

If the electric resistance fluctuation rate of the battery cell 11 calculated by the control unit 103 is greater than the preset lower resistance limit, the control unit 103 may consider the voltage increase and decrease pattern of the battery cell 11 first.

If the voltage increase and decrease pattern of the battery cell 11 is the voltage increase pattern, the control unit 103 may determine the resistance increase and decrease pattern based on the electric resistance fluctuation rate of the battery cell 11. Here, if the resistance increase and decrease pattern of the battery cell 11 is determined as the resistance decrease pattern, the control unit 103 may determine the second degradation acceleration degree of the battery cell 11 based on the voltage fluctuation rate, as shown in FIG. 9. That is, if the resistance increase and decrease pattern of the battery cell 11 is the resistance decrease pattern, the control unit 103 may determine the second degradation acceleration degree of the battery cell 11 only based on the voltage fluctuation rate and the voltage increase and decrease pattern of the battery cell 11. If the resistance increase and decrease pattern of the battery cell 11 is determined as the resistance increase pattern, the control unit 103 may determine the second degradation acceleration degree of the battery cell 11 as any one of accelerated degradation and linear degradation based on the rate of resistance change. That is, only when the voltage increase and decrease pattern of the battery cell 11 is determined as the voltage increase pattern and the resistance increase and decrease pattern is determined as the resistance increase pattern, the control unit 103 may determine the present second degradation acceleration degree of the battery cell 11 as any one of accelerated degradation and linear degradation based on the rate of resistance change of the region to which the present cycle of the battery cell 11 belongs. In addition, the control unit 103 may change the control condition preset for the battery cell 11 only when the second degradation acceleration degree of the battery cell 11 is determined as any one of accelerated degradation and linear degradation. Namely, if the second degradation acceleration degree of the battery cell 11 is determined as decelerated degradation, the control unit 103 may not change the control condition preset for the battery cell 11.

The battery management apparatus 100 according to an embodiment of the present disclosure may determine not only the degradation degree of the battery cell 11 but also the history of the degradation acceleration degree presently performed and the previous degradation acceleration degree. That is, the battery management apparatus 100 according to an embodiment of the present disclosure may more accurately determine the present state of the battery cell 11 and further provide specific information that allows to predict a future situation such as the life of the battery cell 11.

In addition, the battery management apparatus 100 according to an embodiment of the present disclosure may determine the degradation acceleration degree of the battery cell 11 in consideration of the specificity in the discharge situation where the OCV affects the resistance change factor while the battery cell 11 is being discharged. That is, the battery management apparatus 100 may determine the degradation acceleration degree of the battery cell 11 only by the voltage increase and decrease pattern, and may also determine the degradation acceleration degree of the battery cell 11 by considering the voltage increase and decrease pattern and the resistance increase and decrease pattern in combination. Therefore, the battery management apparatus 100 may more specifically determine the state of the battery cell 11 by determining the degradation acceleration degree of the battery cell 11 in diversified ways using various indicators such as the voltage increase and decrease pattern and the resistance increase and decrease pattern.

A battery pack 1000 according to the present disclosure may include the battery management apparatus 100 according to the present disclosure described above. In addition, in addition to the battery management apparatus 100, the battery pack 1000 according to the present disclosure may further include a battery cell, various electrical components (such as a battery management system (BMS), relays, fuses, and the like) and a pack case.

In addition, as another embodiment of the present disclosure, the battery management apparatus 100 may be mounted to various devices using electric energy, such as an electric vehicle, an energy storage system (ESS), and the like. In particular, the battery management apparatus 100 according to the present disclosure may be included in an electric vehicle. That is, the electric vehicle according to the present disclosure may include the battery management apparatus 100 according to the present disclosure. Here, the battery management apparatus 100 may be in the form included in the battery pack 1000, but may be implemented as a device separate from the battery pack 1000. For example, at least a portion of the battery management apparatus 100 may be implemented by an electronic control unit (ECU) of the vehicle. In addition, in addition to the battery management apparatus 100, the vehicle according to the present disclosure may include a chassis and electronic components that are typically provided in the vehicle. For example, in addition to the battery management apparatus 100 according to the present disclosure, the vehicle according to the present disclosure may include a contactor, an inverter, a motor, at least one ECU, and the like. However, the present disclosure is not specially limited to other components of the vehicle other than the battery management apparatus 100.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery module
11: battery cell
100: battery management apparatus
1000: battery pack

What is claimed is:
1. A battery management apparatus, comprising:
a voltage measuring unit configured to:
  measure a voltage of a battery cell; and
  measure an open circuit voltage (OCV) of the battery cell whenever the measured voltage reaches a reference discharge voltage; and
a control unit configured to:
  receive the OCV measured by the voltage measuring unit,
  compare the received OCV with a pre-stored reference voltage;
  calculate a voltage fluctuation rate based on the comparison of the received OCV with the pre-stored reference voltage,
  determine a voltage increase pattern or a voltage decrease pattern based on the calculated voltage fluctuation rate and pre-stored voltage fluctuation rate data,
  determine a first degree to which degradation of the battery cell is changing according to the determined voltage increase pattern or the voltage decrease pattern, and change a preset control condition based on the received OCV and the first determined degree to which degradation of the battery cell is changing.

2. The battery management apparatus according to claim 1,
wherein the pre-stored reference voltage is an OCV of the battery cell when the voltage of the battery cell reaches the reference discharge voltage during a predetermined cycle of the battery cell, and
wherein the pre-stored voltage fluctuation rate data includes a voltage fluctuation rate previously calculated by the control unit.

3. The battery management apparatus according to claim 2,
wherein the control unit is configured to:
calculate a rate of voltage change between the voltage fluctuation rate calculated during a present cycle of the battery cell and a voltage fluctuation rate calculated during a previous cycle of the battery cell within a predetermined number of cycles from the present cycle of the battery cell among the pre-stored voltage fluctuation rate data; and
determine the voltage increase pattern or the voltage decrease pattern based on the calculated rate of voltage change.

4. The battery management apparatus according to claim 1,
wherein the preset control condition includes at least one of a C-rate and a discharge termination voltage set for the battery cell, and
wherein, only when the first determined degree to which degradation of the battery cell is changing is one of accelerated degradation or a linear degradation, the control unit is configured to:
set an OCV of the battery cell previously measured at a start cycle of the determined voltage increase pattern or voltage decrease pattern as a reference OCV,
calculate a voltage comparison value by comparing the set reference OCV with the OCV received from the voltage measuring unit, and
change at least one of the C-rate and or the discharge termination voltage based on a one or more voltage conversion values obtained by converting the calculated voltage comparison value according to a-one or more preset voltage conversion criteria.

5. The battery management apparatus according to claim 4,
wherein the one or more preset voltage conversion criteria includes a first voltage conversion criterion according to which the calculated voltage comparison value is converted into a value corresponding to the C-rate and a second voltage conversion criterion according to which the calculated voltage comparison value is converted into a value corresponding to the discharge termination voltage, and
the control unit is configured to:
obtain a first voltage conversion value by converting the calculated voltage comparison value according to the first voltage conversion criterion,
change the C-rate according to the obtained first voltage conversion value,
obtain a second voltage conversion value by converting the calculated voltage comparison value according to the second voltage conversion criterion, and
change the discharge termination voltage according to the obtained second voltage conversion value.

6. The battery management apparatus according to claim 4,
wherein the control unit is configured to change one or more of the preset voltage conversion criteria only in response to determining that the first degree to which degradation of the battery cell is changing is an accelerated degradation and that at least one of the C-rate or the discharge termination voltage is changed.

7. The battery management apparatus according to claim 6,
wherein after one or more of the preset voltage conversion criteria is changed, the control unit is configured to restore the changed one or more preset voltage conversion criteria to its value before the change only in response to determining that the first determined degree to which degradation of the battery cell is changing is a linear degradation or a decelerated degradation.

8. The battery management apparatus according to claim 1,
wherein the control unit is configured to:
calculate a present resistance of the battery cell based on the received OCV,
calculate an electric resistance fluctuation rate by comparing the calculated present resistance with a pre-stored reference resistance,
determine a resistance increase pattern or a resistance decrease pattern based on the calculated electric resistance fluctuation rate and pre-stored electric resistance fluctuation rate data, determine a second determined degree to which degradation of the battery cell is changing of the battery cell according to the determined voltage increase pattern or the voltage decrease pattern and according to the determined resistance increase pattern or the resistance decrease pattern, and
change the preset control condition based on the calculated electric resistance fluctuation rate and the second determined degree to which degradation of the battery cell is changing.

9. The battery management apparatus according to claim 8,
wherein the pre-stored reference resistance is calculated based on the pre-stored reference voltage, and
wherein the pre-stored electric resistance fluctuation rate data includes a electric resistance fluctuation rate previously calculated by the control unit.

10. The battery management apparatus according to claim 9,
wherein the control unit is configured to:
calculate a rate of resistance change between the electric resistance fluctuation rate calculated during a present cycle of the battery cell and an electric resistance fluctuation rate calculated during a previous cycle of the battery cell within a predetermined number of cycles from the present cycle of the battery cell, wherein the electric resistance fluctuation rate calculated during the previous cycle of the battery cell is included among the pre-stored electric resistance fluctuation rate data, and
determine the resistance increase pattern or the resistance decrease pattern based on the calculated rate of resistance change.

11. The battery management apparatus according to claim 8,
wherein the preset control condition includes at least one of a C-rate or a discharge termination voltage set for the battery cell, and wherein, only when the determined voltage increase pattern or the voltage decrease pattern is a voltage increase pattern and the second determined degree to which degradation of the battery cell is changing is one of an accelerated degradation or a linear degradation, the control unit is configured to:

set an electric resistance fluctuation rate of the battery cell previously measured at a start cycle of the determined resistance increase pattern or resistance decrease pattern as a reference electric resistance fluctuation rate, calculate a resistance comparison value by comparing the set reference electric resistance fluctuation rate with the calculated electric resistance fluctuation rate, and change at least one of the C-rate and the discharge termination voltage based on one or more resistance conversion values obtained by converting the calculated resistance comparison value according to a-one or more preset resistance conversion criteria.

12. The battery management apparatus according to claim 11, wherein the one or more preset resistance conversion criteria includes a first resistance conversion criterion according to which the calculated resistance comparison value is converted into a value corresponding to the C-rate and a second resistance conversion criterion according to which the calculated resistance comparison value is converted into a value corresponding to the discharge termination voltage, and the control unit is configured to:

obtain a first resistance conversion value by converting the calculated resistance comparison value according to the first resistance conversion criterion, change the C-rate according to the obtained first resistance conversion value, obtain a second resistance conversion value by converting the calculated resistance comparison value according to the second resistance conversion criterion, and change the discharge termination voltage according to the obtained second resistance conversion value.

13. The battery management apparatus according to claim 11, wherein the control unit is configured to change one or more of the preset resistance conversion criteria only in response to determining that the second degree to which degradation of the battery cell is changing is an accelerated degradation and that at least one of the C-rate or the discharge termination voltage is changed.

14. The battery management apparatus according to claim 13, wherein after the one or more preset resistance conversion criteria are changed, the control unit is configured to restore the changed one or more preset resistance conversion criteria to its value before the change only in response to determining that the second degree to which degradation of the battery cell is changing is a linear degradation or a decelerated degradation.

15. A battery pack, comprising the battery management apparatus according to claim 1.

* * * * *